(12) United States Patent
Oh et al.

(10) Patent No.: US 9,837,423 B2
(45) Date of Patent: Dec. 5, 2017

(54) SEMICONDUCTOR DEVICES HAVING CHANNELS WITH RETROGRADE DOPING PROFILE

(71) Applicant: Samsung Electronics Co., Ltd., Suwon-Si, Gyeonggi-do (KR)

(72) Inventors: Jeonghoon Oh, Seoul (KR); Ilgweon Kim, Hwaseong-si (KR); Hyon Namkung, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/967,765

(22) Filed: Dec. 14, 2015

(65) Prior Publication Data

US 2016/0204201 A1 Jul. 14, 2016

(30) Foreign Application Priority Data

Jan. 9, 2015 (KR) .................. 10-2015-0003373

(51) Int. Cl.
*H01L 29/10* (2006.01)
*H01L 27/10* (2006.01)
*H01L 27/108* (2006.01)

(52) U.S. Cl.
CPC .. *H01L 27/10891* (2013.01); *H01L 27/10814* (2013.01); *H01L 27/10876* (2013.01)

(58) Field of Classification Search
CPC ... H01L 29/10; H01L 29/104; H01L 29/1041; H01L 29/06; H01L 29/064; H01L 29/0649; H01L 29/42; H01L 29/423; H01L 29/4236; H01L 27/10; H01L 27/108; H01L 27/1081; H01L 27/10814; H01L 27/10876; H01L 27/10891

USPC ......................................................... 257/330
See application file for complete search history.

(56) References Cited

U.S. PATENT DOCUMENTS

| | | |
|---|---|---|
| 6,812,521 B1 | 11/2004 | He et al. |
| 7,842,572 B2 | 11/2010 | Jang et al. |
| 8,273,617 B2 | 9/2012 | Thompson et al. |
| 8,298,895 B1 | 10/2012 | Alptekin |
| 8,298,896 B2 | 10/2012 | Burr et al. |
| 8,399,321 B2 | 3/2013 | Hsu et al. |
| 8,604,527 B2 | 12/2013 | Thompson et al. |
| 8,604,530 B2 | 12/2013 | Thompson et al. |
| 8,664,715 B2 | 3/2014 | Disney et al. |
| 2008/0169493 A1* | 7/2008 | Lee .................. H01L 21/2652 257/296 |

(Continued)

FOREIGN PATENT DOCUMENTS

| | | |
|---|---|---|
| KR | 1020000085581 | 12/2000 |
| KR | 1020030070169 | 10/2003 |

(Continued)

*Primary Examiner* — Monica D Harrison
(74) *Attorney, Agent, or Firm* — Ward and Smith, P.A.

(57) ABSTRACT

A device isolation region is formed, delimiting an active region in a substrate. A word line is formed, extending across the active region and the device isolation region and buried therein. A bit line is formed crossing the word line on the substrate. A channel is formed adjacent the word line, the channel having a retrograde doping profile having a doping concentration that increases away from a top surface of the active region. Formation of the channel includes performing a field ion implantation in the active region having a projected range near a bottom of the device isolation region.

20 Claims, 27 Drawing Sheets

(56) References Cited

U.S. PATENT DOCUMENTS

2012/0267724 A1   10/2012  Venkatesan
2014/0001541 A1    1/2014  Rouh et al.
2015/0021684 A1*  1/2015  Lee .................... H01L 29/7838
                                                                     257/330

FOREIGN PATENT DOCUMENTS

KR    1020070088367    8/2007
KR    1020080014637    2/2008

* cited by examiner

SEMICONDUCTOR DEVICES HAVING CHANNELS WITH RETROGRADE DOPING PROFILE

CROSS-REFERENCE TO RELATED APPLICATION

This application claims the benefit of Korean Patent Application No. 10-2015-0003373, filed on Jan. 9, 2015, in the Korean Intellectual Property Office, the disclosure of which is incorporated herein in its entirety by reference.

BACKGROUND

Example embodiments of the inventive concepts relate to semiconductor devices and methods of manufacturing the same, and/or more particularly, to semiconductor memory devices and methods of manufacturing the same.

As semiconductor devices have become more highly integrated, their structures have become finer and manufacturing processes have become more complicated. In accordance with this trend, a buried channel array transistor (BCAT) having a buried word line has been proposed.

The increasing integration of memory devices has led to increased vulnerability to what is referred to as a "row hammer" phenomenon. Row hammer refers to repeated operation of a word line that can lead to data loss in cells associated with adjacent word lines due to leakage between adjacent cells. Row hammer may be used in security exploits to destroy or alter data.

SUMMARY

Some example embodiments of the inventive concepts provide semiconductor devices having a buried word line and methods of manufacturing the same. In some embodiments, a semiconductor device includes a substrate comprising a device isolation region delimiting an active region, a word line buried in the substrate and a bit line crossing the word line. A channel in the substrate underlies the word line and has an ion implantation region providing a retrograde doping profile that increases in concentration away from the word line. The semiconductor device may include a well ion implantation region in the substrate beneath the channel.

In some embodiments, the ion implantation region may include a first ion implantation region and the device may further include a second ion implantation region of counter to the first ion implantation region in the substrate and closer to a top of the device isolation region than the first ion implantation region.

In some embodiments, the device isolation region may include a first device isolation region having a first thickness and a second device isolation region having a second thickness greater than the first thickness, wherein a bottom of the first device isolation region is closer to the top surface of the active region than a bottom of the second device isolation region.

Further embodiments provide a semiconductor device including a substrate comprising a plurality of device isolation regions delimiting a plurality of active regions, a plurality of word lines buried in the substrate and extending across the active regions, and a plurality of bit lines extending across the word lines. Channels in the active regions underlying the word lines have a retrograde doping profile with a maximum doping concentration at a level lower than a top surface of the active regions. In some embodiments, a top surface of the active region overlapping with the word line is at a higher level than a top surface of the device isolation region overlapping with the word line. The plurality of device isolation regions may include a first device isolation region having a first thickness and a second device isolation region having a second thickness greater than the first thickness, wherein a top of the first device isolation region is at approximately the same level as a top of the second device isolation region and a bottom of the first isolation region is at a higher level than a bottom of the second device isolation region. The device may include a well ion implantation region in the substrate beneath the channels and having a greater doping concentration than the channels. The device may further include a counter ion implantation region in the substrate adjacent a top of the active region or a bottom of the word line. A doping concentration of the channels may be at least $10^{13}$ atoms/$cm^2$.

Still further embodiments provide a semiconductor device including a substrate comprising a device isolation region delimiting an active region, the active region extending in a first direction perpendicular to a top surface of the substrate, a groove extending in a second direction parallel to the top surface of the substrate in the active region and the device isolation region, a buried gate in the groove, a capping film covering the buried gate in the groove and a gate insulation film on an inner surface of the groove between the substrate and the buried gate. A channel in the active region adjacent a side and a bottom of the buried gate has a retrograde doping profile that increases away from a top surface of the active region. The device may further include a well ion implantation region in the substrate below the channel and having a greater doping concentration than a maximum doping concentration of the doping profile of the channel. The device may also include a counter ion implantation region in the substrate nearer the top surface of the active region than the projected range of the implantation region of the channel.

Some embodiments provide a semiconductor device including a substrate and a device isolation region in the substrate and defining an active region of the substrate. A word line overlies the device isolation region and the active region. A channel in the active region adjacent the device isolation region has a doping profile for a first dopant that increases monotonically in a direction away from the word line from an upper surface of the active region to a level of a bottom of the device isolation region.

In some embodiments, the upper surface of active region may be higher than an upper surface of the device isolation region. The device may further include a counter ion region in the channel adjacent an upper surface of the active region and including a second dopant with a different conductivity type than the first dopant.

In further embodiments, the device isolation region may include a first device isolation region on a first side of the active region and the device may further include a second device isolation region on a second side of the channel. In some embodiments, a bottom of the first device isolation region may be closer to the top surface of the active region than a bottom of the second device isolation region. In further embodiments, bottoms of the first and second device isolation regions may be the same distance from the top surface of the active region.

In some embodiments, the active region may include a first active region between the first and second device isolation regions, and the device may further include a second active region in the substrate separated from the first active region by the first device isolation region and a third active region in the substrate separated from the first active region by the second device isolation region, wherein the first active region is closer to the second active region than to the third active region.

In further embodiments, methods include forming a device isolation region delimiting an active region in a substrate, performing a field ion implantation in the active region having a projected range near a bottom of the device isolation region, forming a word line extending across the active region and the device isolation region and buried therein, forming a bit line crossing the word line on the substrate, and heat treating to form a channel adjacent the word line with a retrograde doping profile having a doping concentration that increases away from a top surface of the active region.

In some embodiments, performing the field ion implantation may include implanting ions at a doping concentration ranging from several to tens of $10^{13}$ atoms/cm$^2$ and an energy ranging from about 80 keV to about 110 keV.

The methods may further include performing a well ion implantation in the substrate having a projected range further away from the top surface of the active region than the projected range of the field ion implantation. The well ion implantation may produce a greater doping concentration than the field ion implantation. The methods may also include performing a counter ion implantation in the substrate with a projected range that is closer to the top surface of the active region than the projected range of the field ion implantation. The counter ion implantation may have a projected range near a top of the active region or a bottom of the word line.

In some embodiments, forming the word line may include forming a groove in the active region and the device isolation region, forming an insulating film in the groove, forming a conductive film on the insulating film, and forming a capping film on the conductive film.

In some embodiments, forming the device isolation region may include etching the substrate to form a trench and filling the trench with an insulating film to form a first device isolation region having a first thickness and a second device isolation region having a second thickness greater than the first thickness. The projected range of the field ion implantation may be near a bottom of the first device isolation region.

In methods according to further embodiments, a trench is formed in a substrate and a device isolation region is formed the trench, delimiting an active region. A channel having a retrograde doping profile having a doping concentration that increases away from a top surface of the active region is formed. A groove is formed in the active region and the device isolation region and a gate insulation film is formed in the groove. A buried gate film is formed on the gate insulation film in the groove. Forming the channel includes performing a field ion implantation having a projected range near a bottom of the device isolation region. The field ion implantation may produce a doping concentration ranging from several to tens of $10^{13}$ atoms/cm$^2$ at an energy ranging from about 80 keV to about 110 keV.

The methods may further include performing a well ion implantation in the substrate having a projected range further away from the top surface of the active region than the projected range of the field ion implantation and at a greater doping concentration than the field ion implantation. The methods may also include performing a counter ion implantation in the substrate having a projected range that is closer to the top surface of the active region than the projected range of the field ion implantation.

BRIEF DESCRIPTION OF THE DRAWINGS

Exemplary embodiments of the inventive concepts will be more clearly understood from the following detailed description taken in conjunction with the accompanying drawings. FIGS. 1 through 16 represent non-limiting, example embodiments as described herein.

FIG. 1 illustrates a plan view of a semiconductor device according to an example embodiment of the inventive concepts.

DETAILED DESCRIPTION

Figure 1:
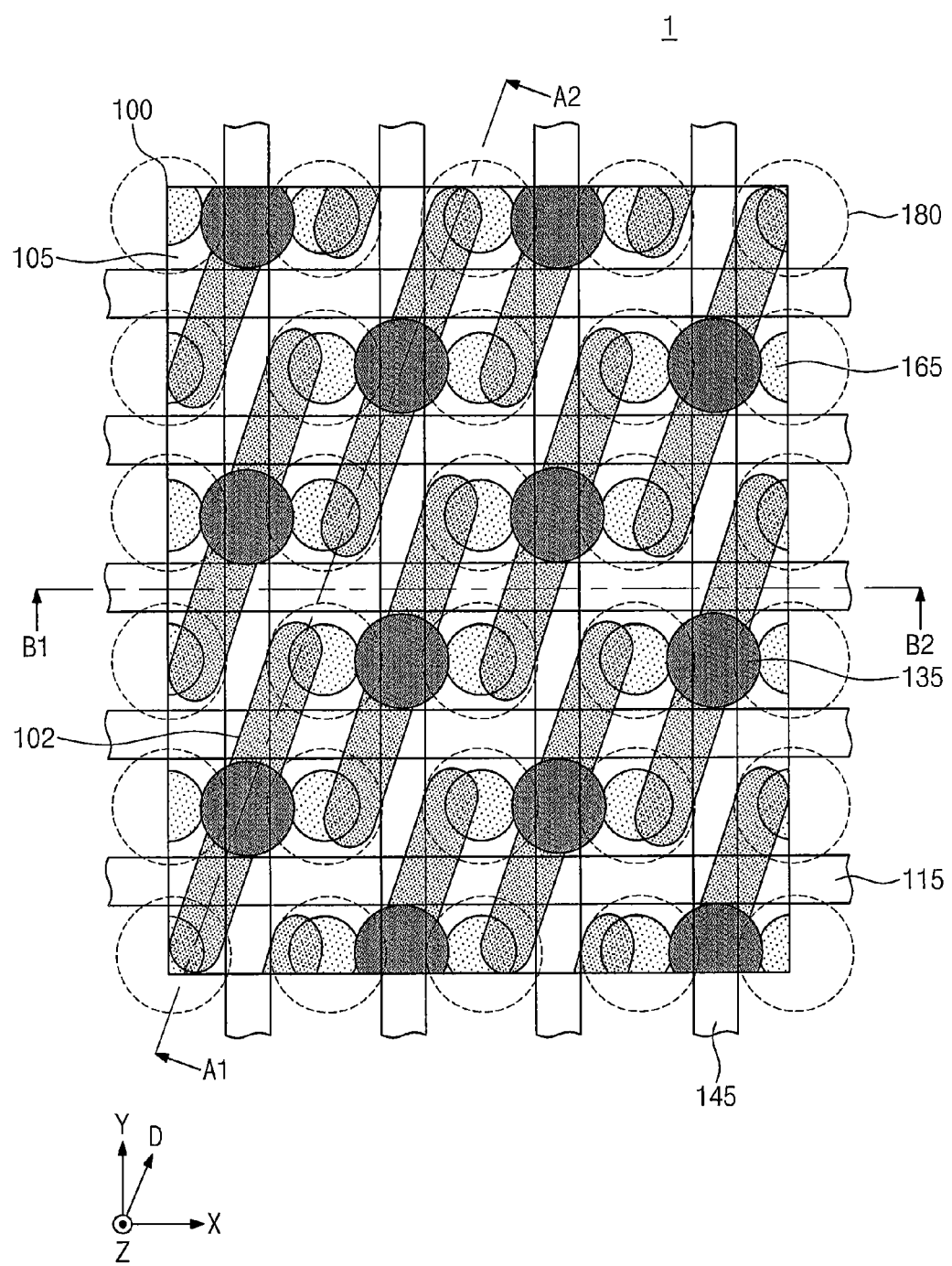

Hereinafter, example embodiments of the inventive concepts will be described with reference to the accompanying drawings. The inventive concepts may, however, be embodied in many different forms and should not be construed as being limited to the embodiments set forth herein; rather, these example embodiments are provided so that this disclosure will be thorough and complete, and will fully convey the inventive concepts to those of ordinary skill in the art. It should be understood, however, that there is no intent to limit the inventive concepts to the particular forms disclosed, but on the contrary, the inventive concepts are to cover all modifications, equivalents, and alternatives falling within the spirit and scope of the inventive concepts. Like reference numerals denote like elements throughout the specification and drawings. In the drawings, the dimensions of structures are exaggerated or reduced for clarity of the inventive concepts.

Also, though terms "first" and "second" are used to describe various members, components, regions, layers, and/or portions in various embodiments of the inventive concepts, the members, components, regions, layers, and/or portions are not limited to these terms. These terms are used only to differentiate one member, component, region, layer, or portion from another one. Therefore, a member, a component, a region, a layer, or a portion referred to as a first member, a first component, a first region, a first layer, or a first portion in an embodiment may be referred to as a second member, a second component, a second region, a second layer, or a second portion in another embodiment.

Unless otherwise defined, all terms used herein, including technical and scientific terms, have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

When a certain embodiment may be implemented differently, a specific process order may be performed differently from the described order. For example, two consecutively described processes may be performed substantially at the same time or performed in an order opposite to the described order.

As used herein, the term "and/or" includes any and all combinations of one or more of the associated listed items. Expressions such as "at least one of," when preceding a list of elements, modify the entire list of elements and do not modify the individual elements of the list.

Example embodiments of the inventive concepts will be described in detail with reference to the accompanying drawings.

Figure 2A:
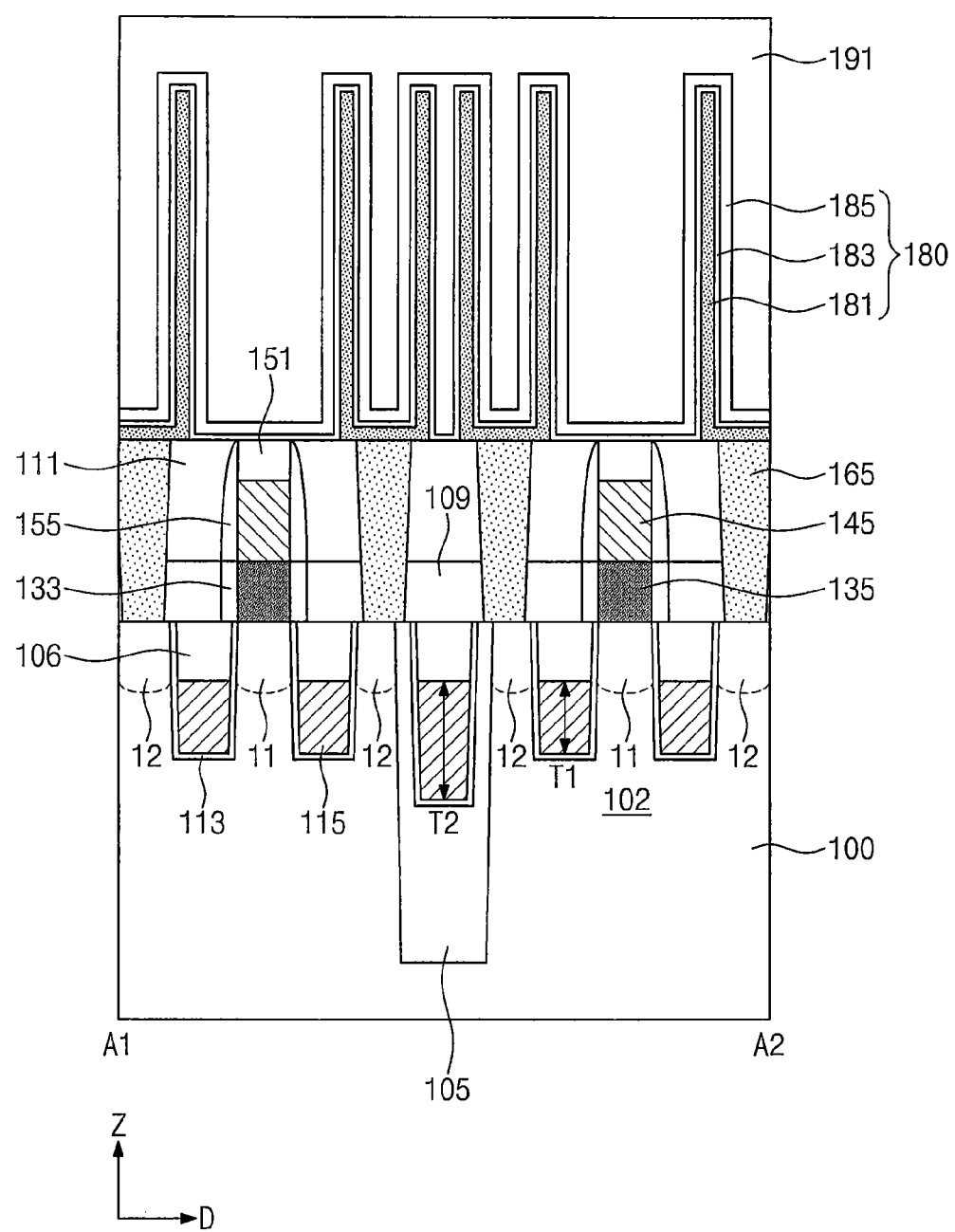
FIG. 2A illustrates a cross-sectional view taken along a line A1-A2 of FIG. 1.
Figure 2B:
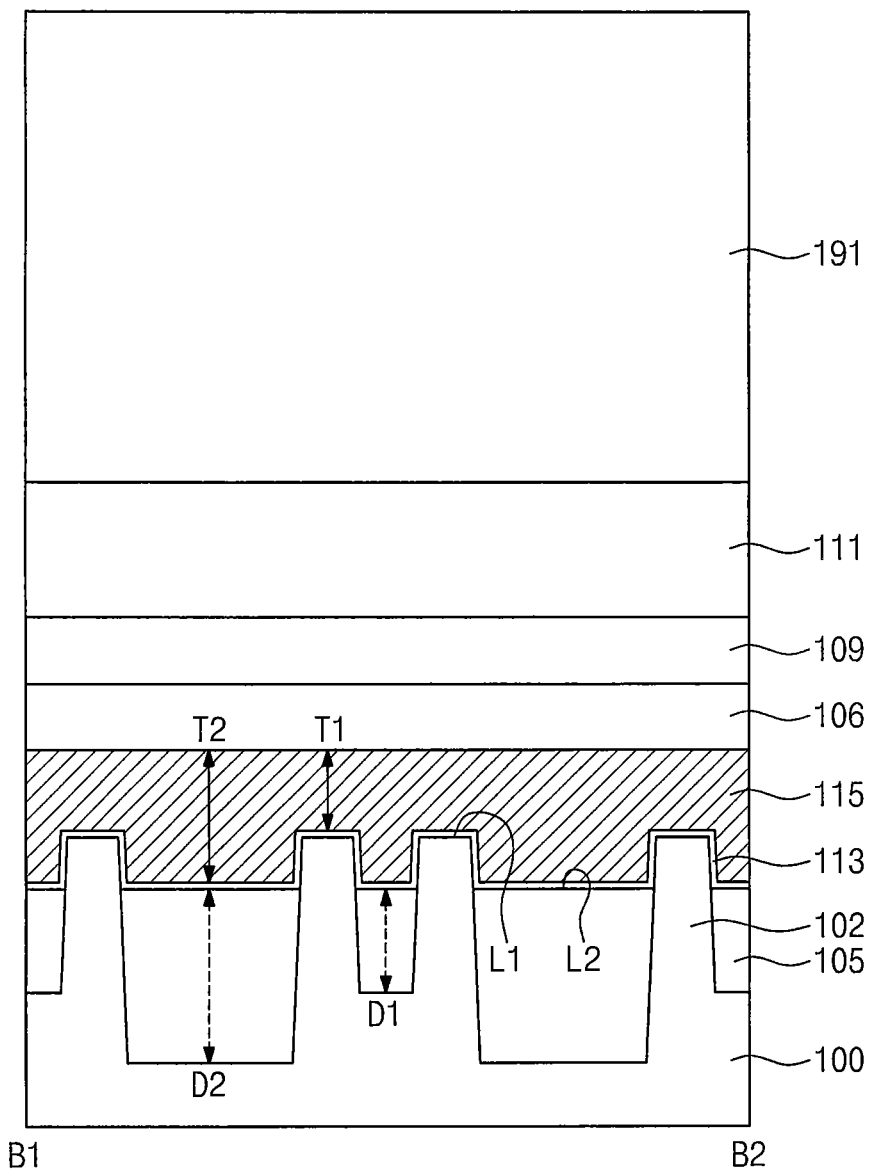
FIG. 2B illustrates a cross-sectional view taken along a line B1-B2 of FIG. 1.
Figure 2C:
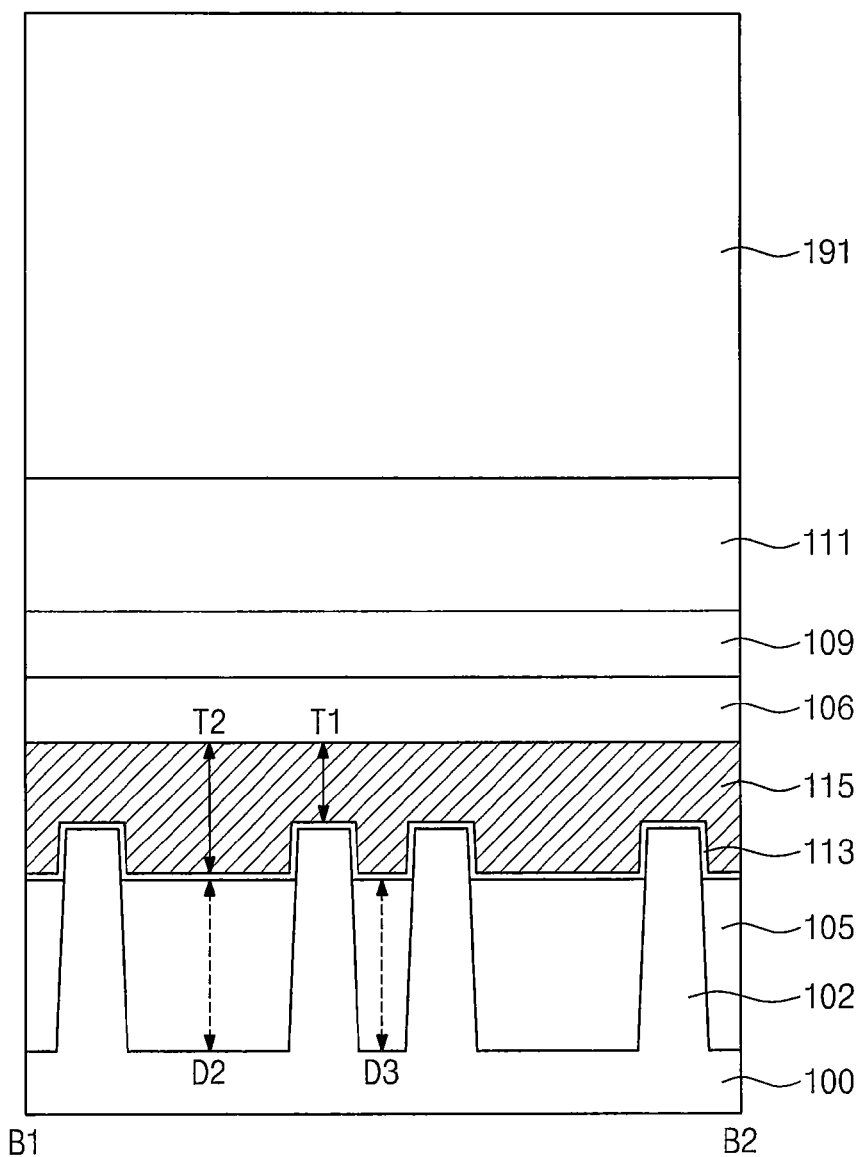
FIG. 2C illustrates a cross-sectional view corresponding to FIG. 2B, according to another example embodiment of the inventive concepts.

FIG. 1 illustrates a plan view of a semiconductor device according to an example embodiment of the inventive concepts. FIG. 2A illustrates a cross-sectional view taken along a line A1-A2 of FIG. 1. FIGS. 2B and 2C illustrate cross-sectional views taken along a line B1-B2 of FIG. 1.

Referring to FIGS. 1, 2A, and 2B, a semiconductor device 1 may include a plurality of word lines 115 that extend in a first direction (X direction) parallel to a top surface of a substrate 100 and a plurality of bit lines 145 that extend in a second direction (Y direction) parallel to the top surface of the substrate 100. The semiconductor device 1 may further include a plurality of capacitors 180 storing information. Accordingly, the semiconductor device 1 may be used as a semiconductor memory device. In FIGS. 1, 2A, and 2B, the first direction (X direction) and the second direction (Y direction) may intersect substantially perpendicular to each other and may be substantially perpendicular to a third direction (Z direction). The third direction (Z direction) may be substantially perpendicular to the top surface of the substrate 100. A diagonal direction (D direction) may intersect the first direction (X direction) and the second direction (Y direction), respectively and may be substantially perpendicular to the third direction (Z direction). The definitions of the above-described directions will be equally applied to all the accompanying drawings.

The substrate 100 may include a plurality of active regions 102 delimited by a device isolation film 105, such as an insulating film. For example, the substrate 100 may be a semiconductor substrate, such as a silicon wafer of a first conductivity type (e.g., P-type). As illustrated in FIG. 1A, each of the active regions 102 may have an island shape and extend along the diagonal direction (D direction). As illustrated in FIG. 2A, the active region 102 may extend in the third direction (Z direction) and may be arranged in a zigzag form along the first direction (X direction). For example, the word lines 115 may extend across the active regions 102 and the bit lines 145 may extend in a direction crossing the word lines 115.

A bit line contact 135 may be disposed on a first junction region 11 of the active region 102, i.e., a portion of the active region 102 vertically overlapping with the bit line 145. A storage node contact 165 may be disposed on a second junction region 12, i.e., a portion of the active region 102 not vertically overlapping with the word line 115 and the bit line 145. The first junction region 11 and the second junction region 12 may be formed in an upper portion of the active region 102 by injecting impurities of a second conductivity type (e.g., N-type). The bit line contact 135 may electrically connect the bit line 145 and the first junction region 11. The storage node contact 165 may electrically connect the capacitor 180 and the second junction region 12.

As illustrated in FIG. 2A, the word line 115 (i.e., a gate electrode) may be buried in the substrate 100 and may be covered with a gate capping film 106. A gate insulation film 113 may be disposed between the gate electrode and the substrate 100. The gate insulation film 113 and the first and second junction regions 11 and 12 disposed in the upper portion of the active region 102 at opposite sides of the gate electrode bound a U-shaped channel in the active region 102 around a side and a bottom of the word line 115.

The bit line 145 may be formed on a first interlayer dielectric film 109 covering the substrate 100. For example, the bit line 145 may be buried in a second interlayer dielectric film 111 covering the first interlayer dielectric film 109. A bit line spacer 155 may be formed on sidewalls of the bit line 145. A bit line capping film 151 may be formed on a top surface of the bit line 145. The bit line contact 135 may be in contact with the first junction region 11 and the bit line 145 by passing through the first interlayer dielectric layer 109 covering the substrate 100. A spacer 133 may be further provided on sidewalls of the bit line contact 135.

A capacitor 180 that includes a lower electrode 181, an upper electrode 185, and a dielectric film 183 therebetween may be arranged on the second interlayer dielectric film 111. The capacitor 180 may be covered with a third interlayer dielectric film 191. The storage node contact 165 may be in contact with the second junction region 12 and the lower electrode 181 by passing through the first interlayer dielectric film 109 and the second interlayer dielectric film 111.

As illustrated in FIG. 2B, a top surface level L1 of the active region 102 under the word line 115 may be higher than a top surface level L2 of the device isolation film 105 under the word line 115. Accordingly, the active region 102 may have a fin structure that protrudes over the device isolation film 105.

Due to the fin structure of the active region 102, the word line 115 may have a non-uniform thickness. For example, as illustrated in FIGS. 2A and 2B, the word line 115 may have a first thickness T1 on the active region 102 and a second thickness T2 greater than the first thickness T1 on the device isolation film 105. Unless otherwise defined, a term "thickness" means a size in a direction perpendicular with respect to the substrate 100.

At least two device isolation films 105 may have different thicknesses. For example, as illustrated in FIG. 2B, respective distances between the active regions 102 arranged along the length direction of the word line 115 may be different from each other. In this case, a first device isolation film 105 between the active regions 102 that are spaced apart by a relatively short distance may have a first thickness D1 and a second device isolation film 105 between the active regions 102 that are spaced apart by a relatively long distance may have a second thickness D2 greater than the first thickness D1. In other words, a bottom of the first device isolation film 105 having the first thickness D1 may be closer to a top surface of the active region than a bottom of the second device isolation film 105 having the second thickness D2.

In an example embodiment, as illustrated in FIG. 2C, a third thickness D3 of a third device isolation film 105 between the active regions 102 that are spaced apart by a relatively short distance may be substantially the same as or similar to the second thickness D2 of the second device isolation film 105 between the active regions 102 that are spaced apart by a relatively long distance.

Figure 3A:
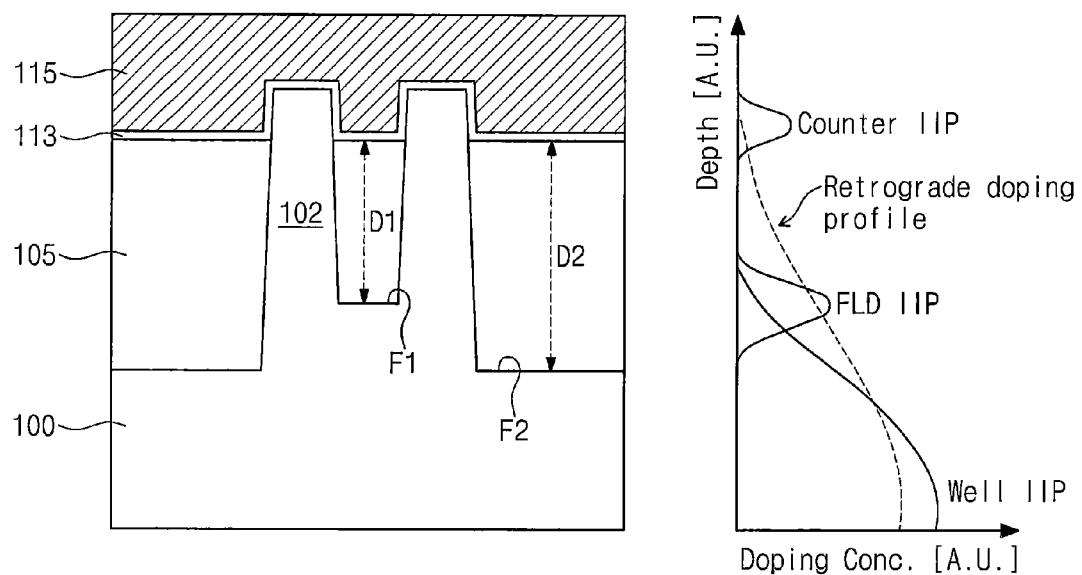
FIG. 3A illustrates a cross-sectional view of a portion of FIG. 2B and an example of a graph of a doping profile.
Figure 3B:
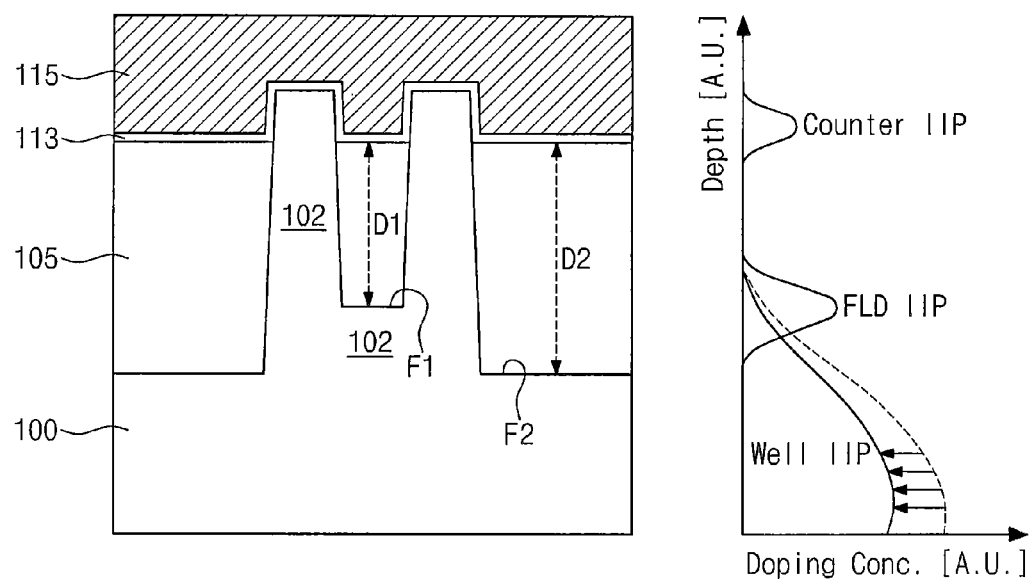
FIGS. 3B, 3C and 3D illustrate cross-sectional views of a portion of FIG. 2B and other examples of graphs of a doping profile.
Figure 3C:
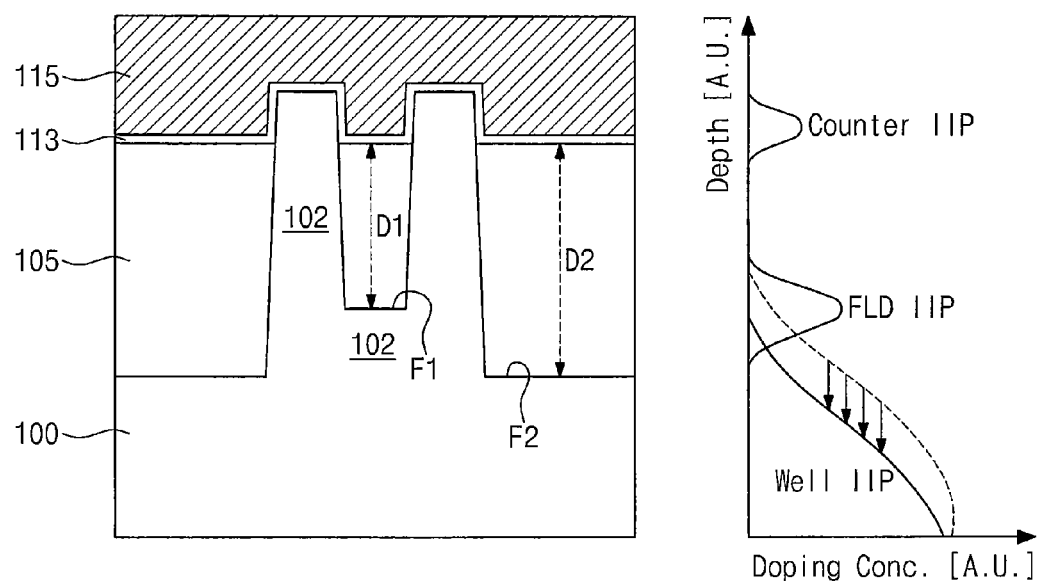
Figure 3D:
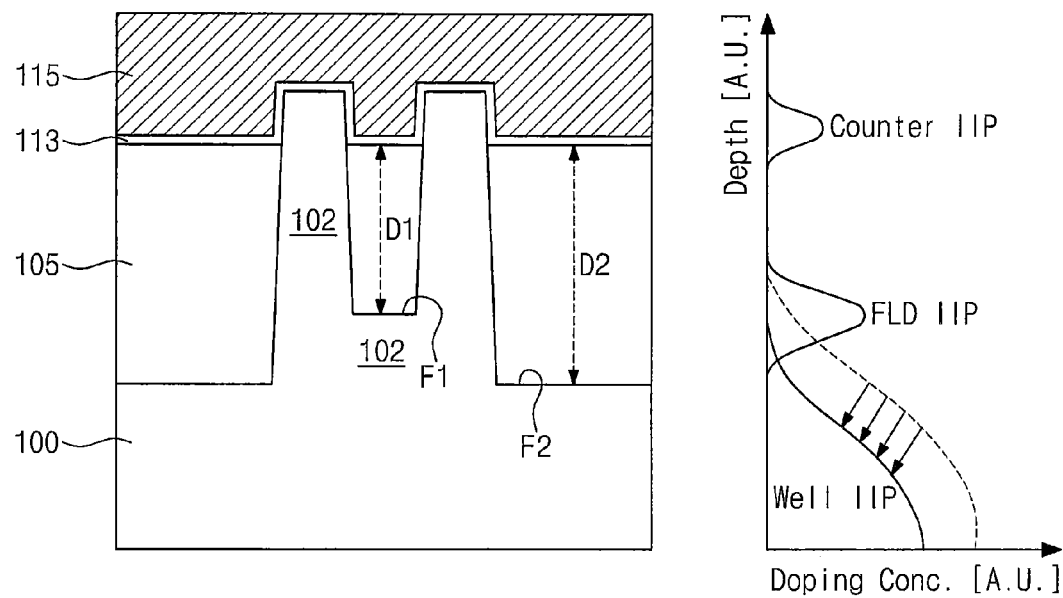
Figure 10A:
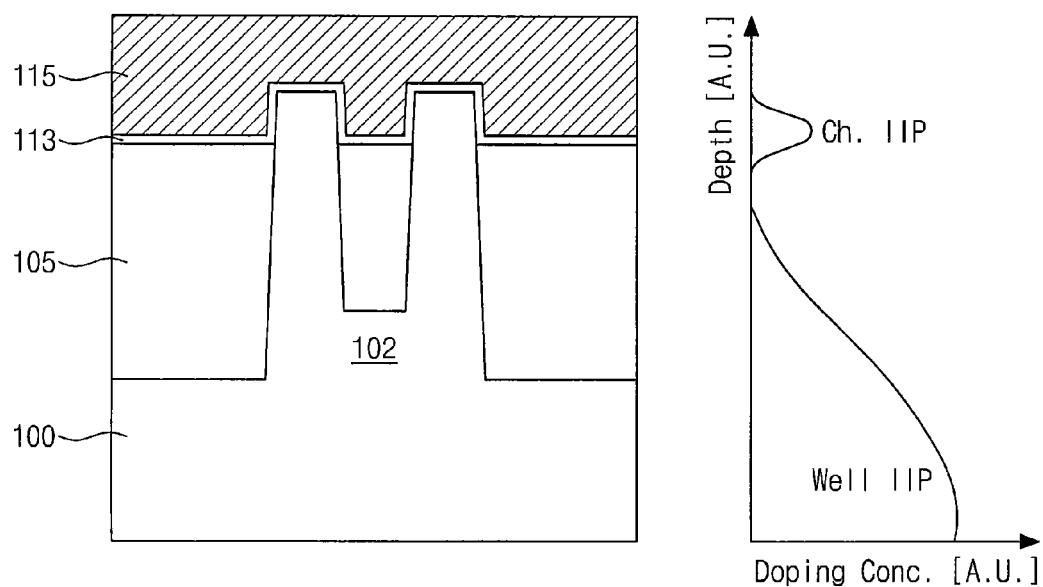
FIG. 10A illustrates a cross-sectional view of a semiconductor device according to a comparative example and a graph of a doping profile of the semiconductor device.
Figure 10B:
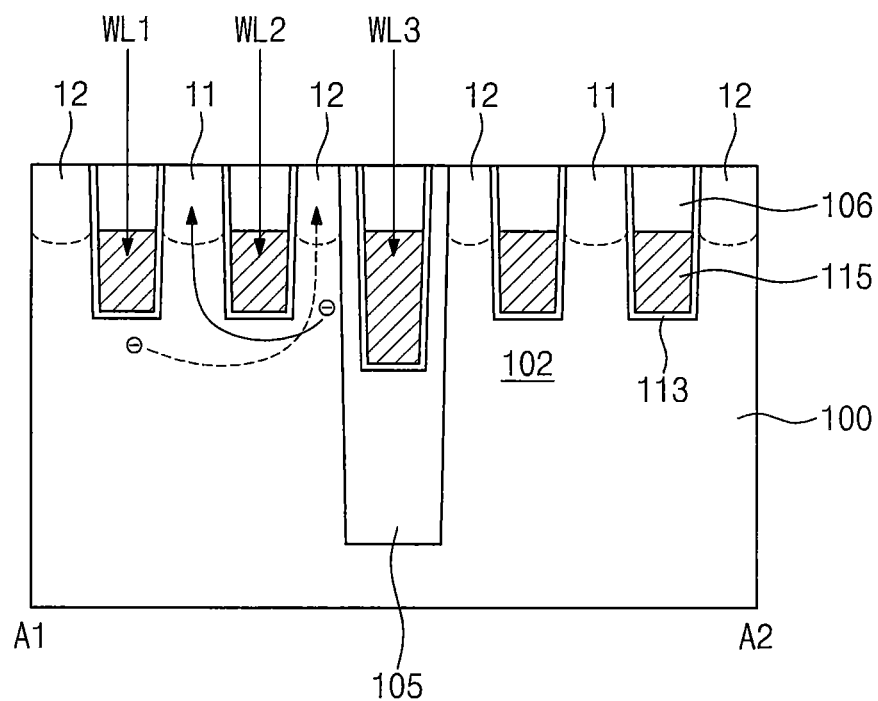
FIG. 10B illustrates a cross-sectional view of a semiconductor device according to a comparative example.

FIG. 3A illustrates a cross-sectional view of a portion of FIG. 2B and an example of a graph of a doping profile. FIGS. 3B, 3C and 3D illustrate cross-sectional views of a portion of FIG. 2B and other examples of graphs of a doping profile. FIG. 10A illustrates a cross-sectional view of a semiconductor device according to a comparative example and a graph of a doping profile of the semiconductor device. FIG. 10B illustrates a cross-sectional view of a semiconductor device according to a comparative example. A horizontal axis of the graphs denotes a doping concentration and a vertical axis thereof denotes a depth of an active region. The doping concentration and the depth are arbitrary units.

Referring to FIG. 3A, according to an example embodiment of the inventive concepts, a field ion implantation (FLD IIP) process that targets a point below the top surface of the active region 102 may be provided to form a retrograde doping profile in the channel in the active region 102. If the retrograde doping profile in the channel is formed through the field ion implantation (FLD IIP) process, it is possible to improve row hammer characteristics, as will be explained below, without any substantial variation in cell characteristics, such as threshold voltage Vth.

Referring to FIGS. 10A and 10B, unlike the present example embodiments of the inventive concepts, a conventional device includes a channel formed through a channel ion implantation (Ch. IIP) process that targets a top of the active region 102. Such a structure may be more vulnerable to a row hammer phenomenon or one row disturbance phenomenon in which, by repeated operation of a certain word line 115, data loss in an adjacent word line 115 occurs. For example, as illustrated in FIG. 10B, an electron of the first word line WL1 may move toward the second word line WL2 by repeated operation of the first word line WL1 (dotted line arrow), or by repeated operation of the third word line WL3, an electron of the second word line WL2 may move toward the first word line WL1 (solid line arrow). Accordingly, loss of data may occur from the cell in which the second word line WL2 belongs.

A main factor of these row hammer characteristics may be a leakage current in an off state. In other words, the row hammer characteristics depend on the leakage current in the off state. Accordingly, as a threshold voltage of a cell becomes high, resistance to the row hammer phenomenon may be improved. However, if a threshold voltage of a cell varies, cell characteristics such as a write operation or an operation speed may be changed.

It may be possible to prevent a transfer of an electron between cells by heightening a conduction band energy barrier between adjacent word lines 115. In some embodiments, resistance to the row hammer phenomenon may be improved by increasing a doping concentration. If a doping concentration of a point corresponding to a movement path of an electron increases, the row hammer characteristics may be improved without undesirable variation of a threshold voltage.

Referring again to FIG. 3A, a field ion implantation region may be formed in the substrate 100 through a field ion implantation (FLD IIP) process that targets a bottom of the device isolation film 105. In an example embodiments, as illustrated in FIG. 2B, in the case where thicknesses of device isolation films 105 are different from each other, the field ion implantation (FLD IIP) process may be performed to target a first level F1 of the bottom of the first device isolation film 105 having the first thickness D1 less than the second thickness D2. A top of the first device isolation film 105 having the first thickness D1 may have the same level as a top of the second device isolation film 105 having the second thickness D2. The bottom of the first device isolation film 105 having the first thickness D1 may be in a higher level than the bottom of second device isolation film 105 having the second thickness D2. In other word, the bottom of the first device isolation film 105 having the first thickness D1 may be closer to the top surface of the active region than the bottom of the second device isolation film 105 having the second thickness D2. A projected range Rp in a doping profile of the field ion implantation region may be near the first level F1 of the bottom of the first device isolation film 105 having the thickness D1. Impurities of the field ion implantation region may have the same conductivity type as the substrate 100 (e.g., P-type).

The field ion implantation (FLD IIP) process may be performed in the condition of a doping concentration and a doping energy greater than the channel ion implantation (Ch. IIP) process. For example, If a doping concentration and a doping energy of the channel ion implantation (Ch. IIP) process range about $10^{12}$ atoms/cm$^2$ and from about 40 keV to about 60 keV, respectively, a doping concentration and a doping energy of the field ion implantation (FLD IIP) process may range from several to tens of $10^{13}$ atoms/cm$^2$ and from about 80 keV to about 110 keV, respectively. In an example embodiment, the doping concentration of the field ion implantation region may be about $10^{13}$ atoms/cm$^2$ or more.

In an example embodiment, the field ion implantation (FLD IIP) process may be performed so as to target a second level F2 of the bottom of the second device isolation film 105 having the second thickness D2.

In an example embodiment, a well ion implantation (Well IIP) process may be further performed to form a well ion implantation region in the substrate 100. A doping profile of the well ion implantation region may be further away from the top surface of the active region 102 than a doping profile of the field ion implantation region. The doping profile of the well ion implantation region may have a greater doping concentration than the field ion implantation region. In other words, a projected range Rp in the doping profile of the well ion implantation region may be in a lower level than the projected range Rp in the doping profile of the field ion implantation region in the substrate 100. Impurities of the well ion implantation region may have the same conductivity type as the substrate 100 (e.g., P-type).

In an example embodiment, through the well ion implantation (Well IIP) process and the field ion implantation (FLD IIP) and a heat treatment process for activating impurities in the substrate 100, a retrograde channel may be formed in the active region 102 of the substrate 100. The retrograde channel may have a doping profile (i.e., a retrograde doping profile) in which a doping concentration monotonically increases away from the top surface of the active region 102 to at least a level of a bottom of device isolation film 105. It may be possible to form the retrograde channel by performing only the field ion implantation (FLD IIP) process and the heat treatment process without the well ion implantation (Well IIP) process. In other words, the field ion implantation region alone may provide the retrograde channel profile.

In an example embodiment, a counter ion implantation (Counter IIP) process may be further performed to form a counter ion region in the substrate 100. The counter ion implantation (Counter IIP) process may be performed to target a top of the active region 102, a top of the device isolation film 105, or a bottom of the word line 115. In other words, the counter ion implantation may have a projected range Rp adjacent to the top of the active region 102, the top of the device isolation film 105, or the bottom of the word line 115. Therefore, the counter ion implantation may be concentrated closer to the top surface of the active region 102 than the field ion implantation. Impurities of the counter ion implantation region may have a different conductivity type from the substrate 100 (e.g., N-type). The counter ion implantation (Counter IIP) process may adjust the maximum value of the total doping concentration of the retrograde channel and a threshold voltage. For example, through the counter ion implantation process, the maximum value of the total doping concentration of the retrograde channel may be distributed in a lower level than in case of not performing the counter ion implantation process.

In an example embodiment, in order to minimize or eliminate a variation of a threshold voltage, a doping concentration of the well ion implantation process may be reduced and/or a doping energy of the well ion implantation process may be increased. For example, as illustrated in FIG. 3B, a doping profile of the well ion implantation region may be shifted on the left side by lowering a doping concentration of the well ion implantation process. In an example embodiment, as illustrated in FIG. 3C, a doping profile of the well ion implantation region may be shifted downwards by increasing a doping energy of the well ion implantation process. In an example embodiment, as illustrated in FIG. 3D, a doping profile of the well ion implantation region may be shifted on the left side and downwards by lowering a doping concentration of the well ion implantation process and by increasing a doping energy of the well ion implantation process. In a case where a doping concentration and/or a doping energy of the well ion implantation process vary, the counter ion implantation process may be not performed or further performed.

In a case where the well ion implantation process and/or the counter ion implantation process are performed, it may be possible to change a doping concentration of the field ion implantation process. For example, if a doping concentration of the well ion implantation process is reduced, it may be possible to increase a doping concentration of the field ion implantation process. If a doping energy of the well ion implantation process increases, it may be possible to increase a doping concentration of the field ion implantation process. In a case where the counter ion implantation is performed, it may be possible to increase a doping concentration of the field ion implantation process.

Figure 4A:
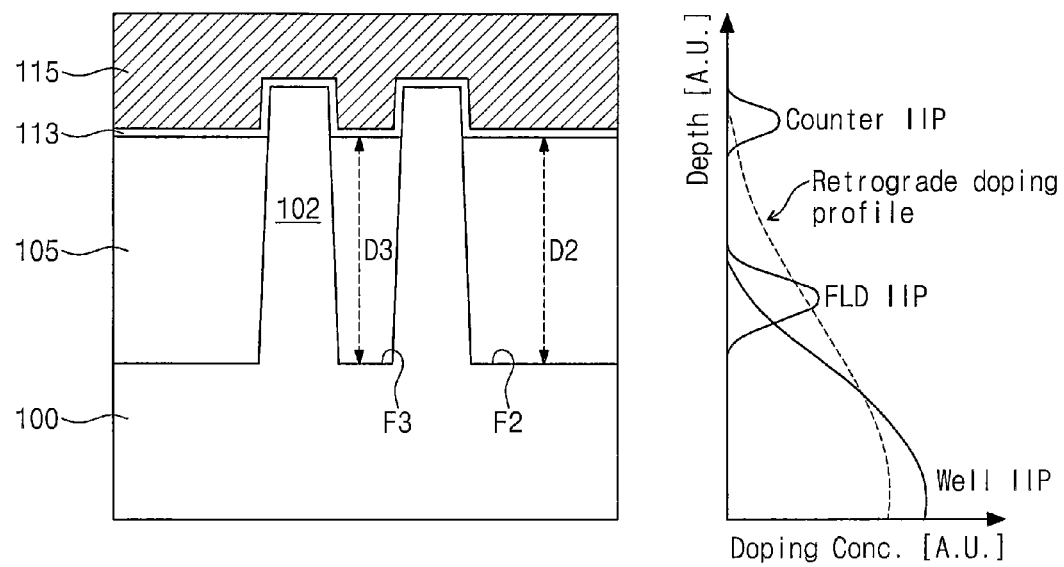
FIG. 4A illustrates a cross-sectional view of a portion of FIG. 2C and an example of a graph of a doping profile.
Figure 4B:
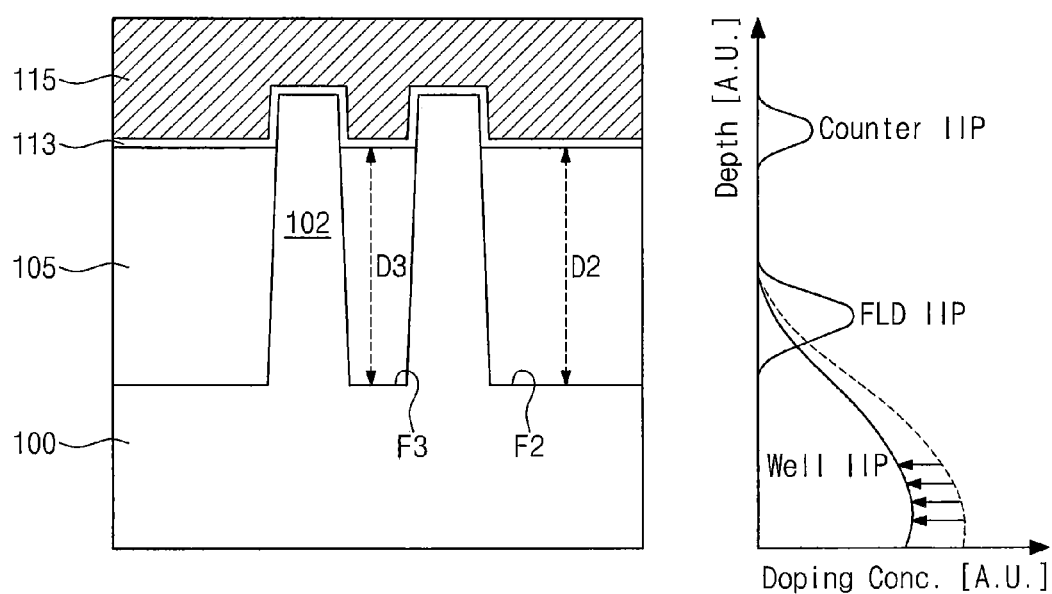
FIGS. 4B, 4C, and 4D illustrate cross-sectional views of a portion of FIG. 2C and other examples of graphs of a doping profile.
Figure 4C:
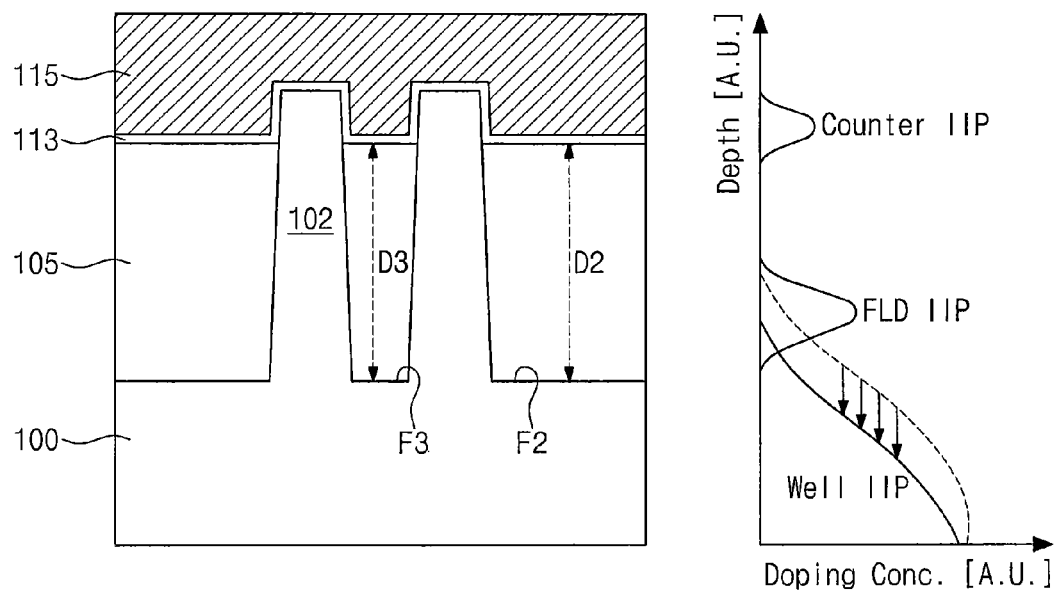
Figure 4D:
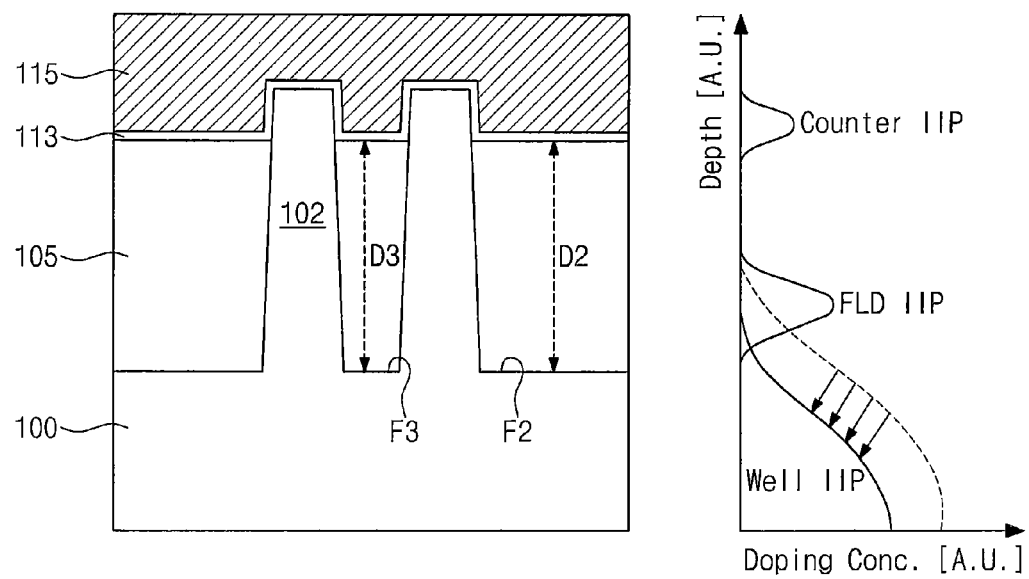

FIG. 4A illustrates a cross-sectional view of a portion of FIG. 2C and an example of a graph of a doping profile. FIGS. 4B, 4C, and 4D illustrate cross-sectional views of a portion of FIG. 2C and other examples of graphs of a doping profile. A horizontal axis of the graphs denotes a doping concentration and a vertical axis thereof denotes a depth of an active region. The doping concentration and the depth are arbitrary units.

Referring to FIG. 4A, as illustrated in FIG. 2C, in the case where thicknesses of the device isolation films 105 are uniform with each other, a field ion implantation region may be formed in the substrate 100 through a field ion implantation (FLD IIP) process that targets the third level F3 of the bottom of the third device isolation 105 having the third thickness D3 or the second level F2 of the bottom of the second device isolation film 105 having the second thickness D2. In an example embodiment, in this case, at least one of the well ion implantation process and the field ion implantation process may be further performed.

Through the well ion implantation process, the field ion implantation process, and a heat treatment process, a retrograde channel may be formed to have a doping profile (i.e., retrograde doping profile) in which a doping concentration increases away from the top surface of the active region 102. It may be possible to form the retrograde channel by performing only the field ion implantation (FLD IIP) process and the heat treatment process without the well ion implantation (Well IIP) process.

In an example embodiment, in order to minimize or eliminate a variation of a threshold voltage, it may be possible to change a doping concentration and/or a doping energy of the well ion implantation process For example, as illustrated in FIG. 4B, a doping concentration of the well ion implantation process may be reduced, as illustrated in FIG. 4C, a doping energy of the well ion implantation process may be increased, or as illustrated in FIG. 4D, a doping concentration of the well ion implantation process may be reduced and a doping energy of the well ion implantation process may be increased.

In an example embodiment, the retrograde channel mentioned to FIGS. 1 through 4D may be provided under the word lines 115 in the substrate 100 and may have a projected range in a lower level than the top surface of the active region 102.

In an example embodiment, the U-shaped channel that surrounds the side and the bottom of the buried gate electrode in the active region 102 may have the retrograde channel. In other words, the U-shaped channel may have a projected range adjacent to the bottom of the device isolation film 105 and a doping profile in which a doping concentration increases away from the top surface of the active region 102.

FIGS. 5A, 6A, 7A, 8A, and 9A are cross-sectional views taken along the line A1-A2 of FIG. 1 that illustrate a method of manufacturing a semiconductor device according to an example embodiment of the inventive concepts. FIGS. 5B, 6B, 7B, 8B, and 9B are cross-sectional views taken along the line B1-B2 of FIG. 1 that illustrate a method of manufacturing a semiconductor device according to an example embodiment of the inventive concepts. FIGS. 5C, 6C, 7C, 8C, and 9C illustrate cross-sectional views corresponding to FIGS. 5B, 6B, 7B, 8B, and 9B, respectively, according to still another example embodiment of the inventive concepts.

Figure 5A:
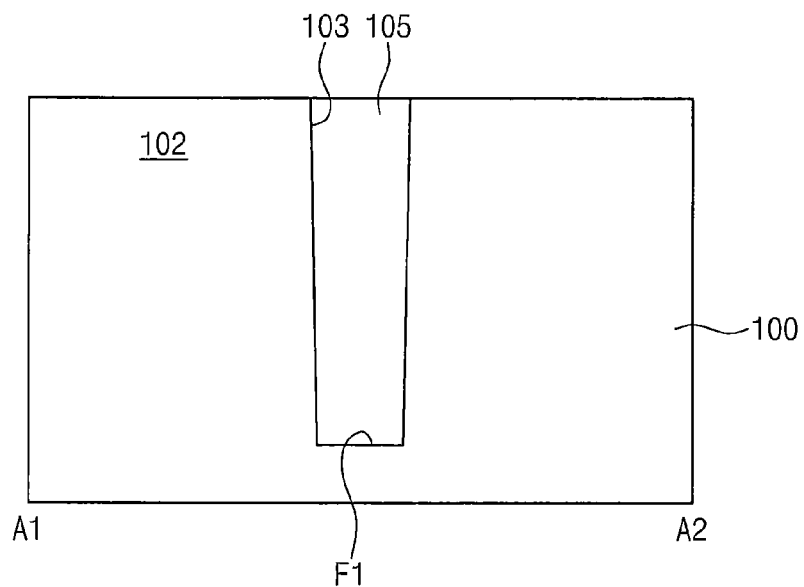
FIGS. 5A, 6A, 7A, 8A, and 9A are cross-sectional views taken along the line A1-A2 of FIG. 1 that illustrate a method of manufacturing a semiconductor device according to an example embodiment of the inventive concepts.
Figure 5B:
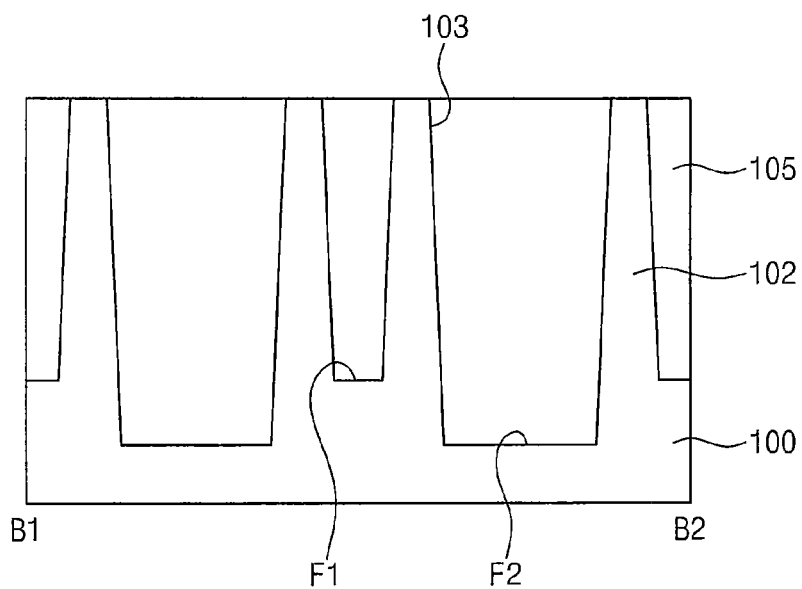
FIGS. 5B, 6B, 7B, 8B, and 9B are cross-sectional views taken along the line B1-B2 of FIG. 1 that illustrate a method of manufacturing a semiconductor device according to an example embodiment of the inventive concepts.

Referring to FIGS. 5A and 5B, the device isolation film 105 may be formed in the substrate 100 to delimit the plurality of the active regions 102. For example, the device isolation film 105 may be formed by forming a trench in the substrate 100 such as a silicon wafer and filling the trench 103 with an insulating film such as an oxide film (e.g., SiOx) or a nitride film (e.g., SiNx, SiON). Each of the active regions 102 may be an island shape when viewed on a plane. Each of the active regions 102 may be a vertical pillar shape when viewed from a cross-sectional view. In other words, the active regions 102 may extend in the direction perpendicular to the top surface of the substrate 100.

The well ion implantation (Well IIP) process may be further performed to form the well ion implantation region in the substrate 100 prior to forming the device isolation film 105 or after forming the device isolation film 105. Impurities of the well ion implantation process may have the same conductivity type as the substrate 100 (e.g., P-type).

At least two trenches 103 when viewed from the cross-sectional view taken along the line B1-B2 of FIG. 1 may have different depths. For example, as illustrated in FIG. 5B, a first trench 103 between the active regions 102 that are spaced apart by a relatively short distance may have a depth less than a second trench 103 between the active regions 102 that are spaced apart by a relatively long distance. In other words, a bottom of the first trench 103 between the active regions 102 that are spaced apart by a relatively short distance may have a first level F1 and a bottom of the second trench 103 between the active regions 102 that are spaced apart by a relatively long distance may have a second level F2 lower than the first level F1.

Figure 5C:
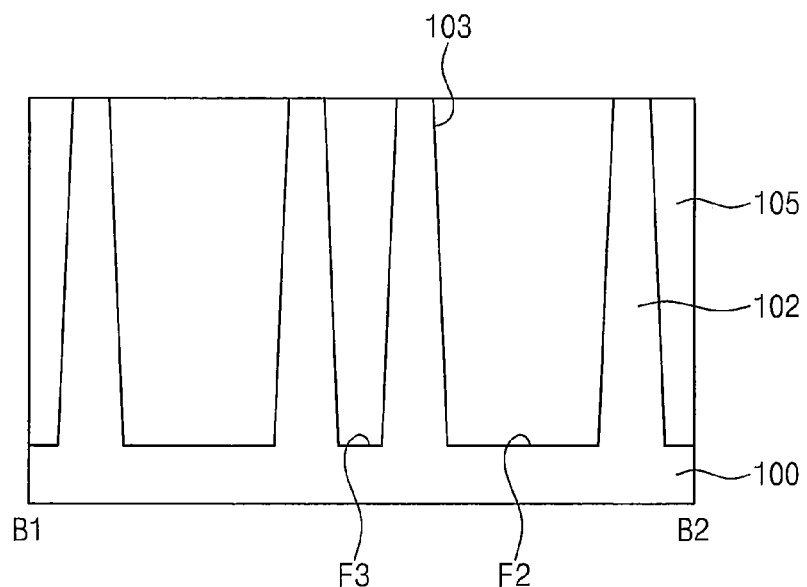
FIGS. 5C, 6C, 7C, 8C, and 9C illustrate cross-sectional views corresponding to FIGS. 5B, 6B, 7B, 8B, and 9B, respectively, according to still another example embodiment of the inventive concepts.

In an example embodiment, at least two trenches 103 when viewed from the cross-sectional view taken along the line B1-B2 of FIG. 1 may have a same depth. For example, as illustrated in FIG. 5C, a third trench 103 between the active regions 102 that are spaced apart by a relatively short distance may have the same depth as the second trench 103 between the active regions 102 that are spaced apart by a relatively long distance. In other words, a bottom of the third trench 103 between the active regions 102 that are spaced apart by a relatively short distance may have a third level F3 and the bottom of the second trench 103 between the active regions 102 that are spaced apart by a relatively long distance may have the second level F2 that are substantially the same as or similar to the third level F3.

Figure 6A:
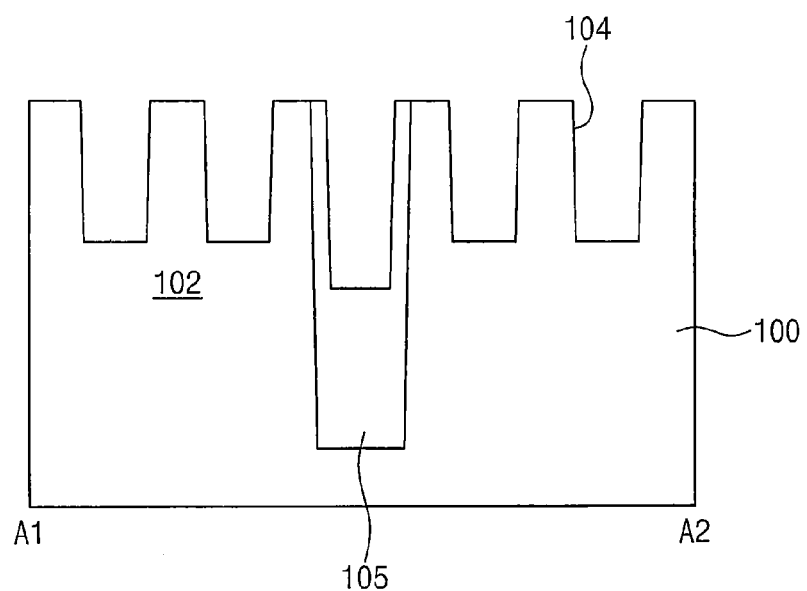
Figure 6B:
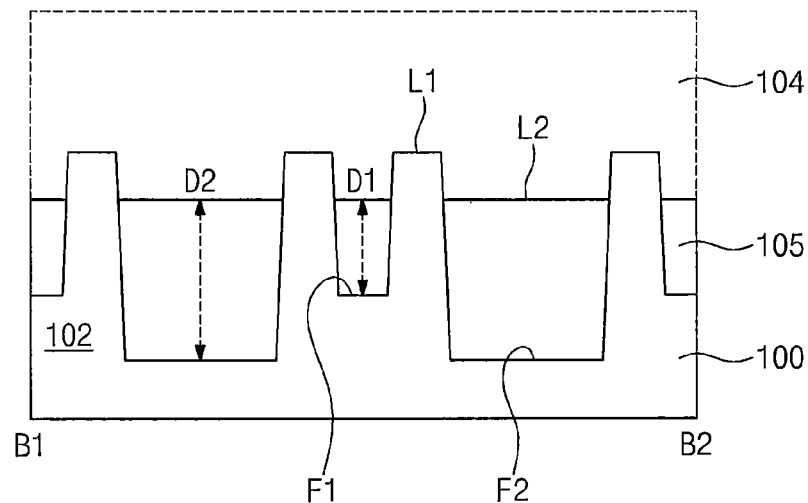

Referring to FIGS. 6A and 6B, a groove 104 may be formed by partially etching the substrate 100. For example, the groove 104 that extends along the line B1-B2 of FIG. 1 in the direction perpendicular to the top surface of the substrate 100 may be formed in the substrate 100 by partially recessing the active region 102 and the device isolation film 105. Since the device isolation film 105 is removed more than the active region 102 due to different etch selectivity each other, as illustrated in FIG. 6B, the top surface level L1 of the active region 102 may be higher than the top surface level L2 of the device isolation film 105. In other words, a portion of the active region 102 may protrude over the device isolation film 105 (referred to as so-called "fin-structure")

As previously illustrated in FIGS. 5A and 5B, depths of the trenches 130 may be different from each other. Therefore, the first device isolation film 105 buried in the first trench 103 between the active regions 102 that are spaced apart by a relatively short distance may have the first thickness D1, and the second device isolation film 105 buried in the second trench 103 between the active regions 102 that are spaced apart by a relatively long distance may have the second thickness D2 greater than the first thickness D1.

Prior to forming the device isolation film 105 or after forming the device isolation film 105, a field ion implantation (FLD IIP) process may be performed to form the field ion implantation region. The field ion implantation (FLD IIP) process may be performed to target a point below the top of the active region 102, e.g., the first level F1 of the bottom of the first device isolation film 105 having the first thickness D1 as illustrated in FIG. 6B. In an example embodiment, the field ion implantation (FLD IIP) process may be performed to target the second level F2 of the bottom of the second device isolation film 105 having the second thickness D2. The retrograde channel may be formed in the active region 102 through the field ion implantation (FLD IIP) process.

The field ion implantation (FLD IIP) process may be performed in the condition of a high doping concentration ranging from several to about tens of $10^{13}$ atoms/cm$^2$ and a high doping energy ranging from about 80 keV to about 110 keV. Impurities of the field ion implantation (FLD IIP) process may have the same conductivity type as the substrate 100 (i.e., P-type)

In an example embodiment, a counter ion implantation (Counter IIP) process may be further performed to form a counter ion implantation region. Impurities of the counter ion implantation (Counter IIP) process may have a different conductivity type from the substrate 100 (i.e., N-type). The counter ion implantation (Counter IIP) process may be performed to target the top of the active region 102 or the top of the device isolation film 105.

Figure 6C:
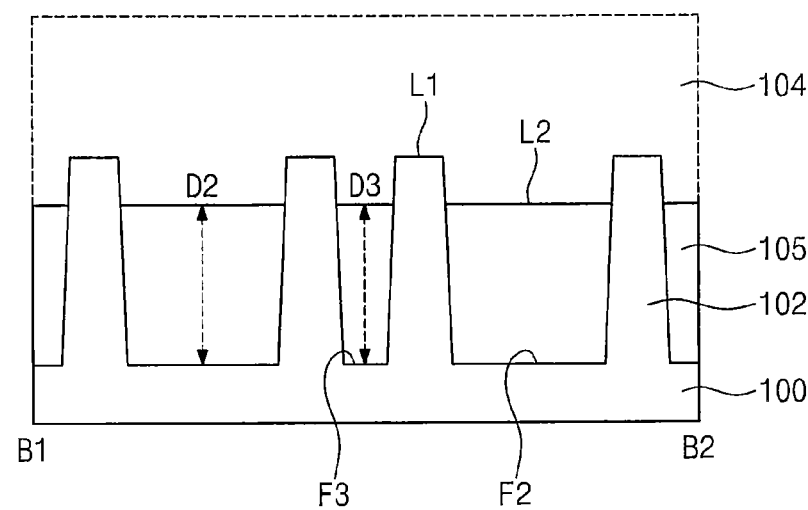

In an example embodiment, as illustrated in FIG. 6C, depths of the trenches 103 may be substantially the same. Therefore, the third device isolation film 105 buried in a third trench 103 between the active regions 102 that are spaced apart by a relatively short distance may have a third thickness D3, and the second device isolation film 105 buried in the second trench 103 between the active regions 102 that are spaced apart by a relatively long distance may have the second thickness D2 that is substantially the same as the third thickness D3. In this case, the field ion implantation (FLD IIP) process may be performed to target the third level F3 or the second level F2 of the bottom of the device isolation film 105.

Figure 7A:
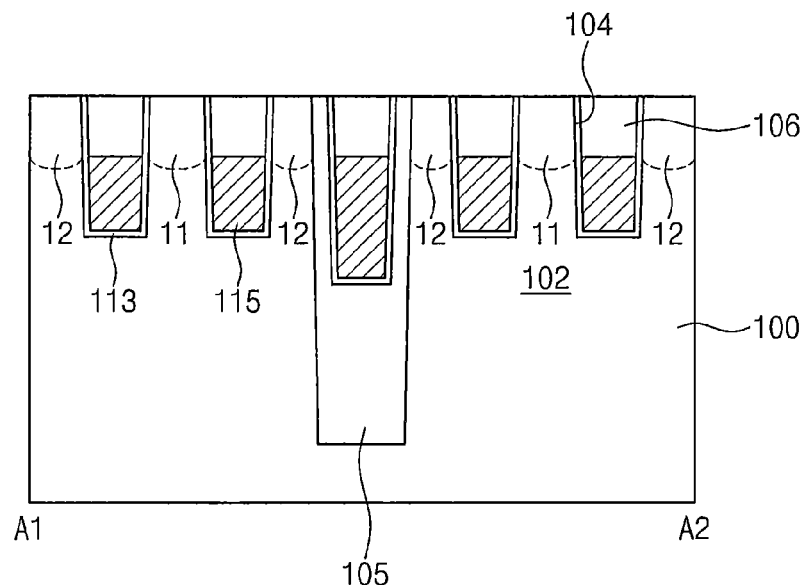
Figure 7B:
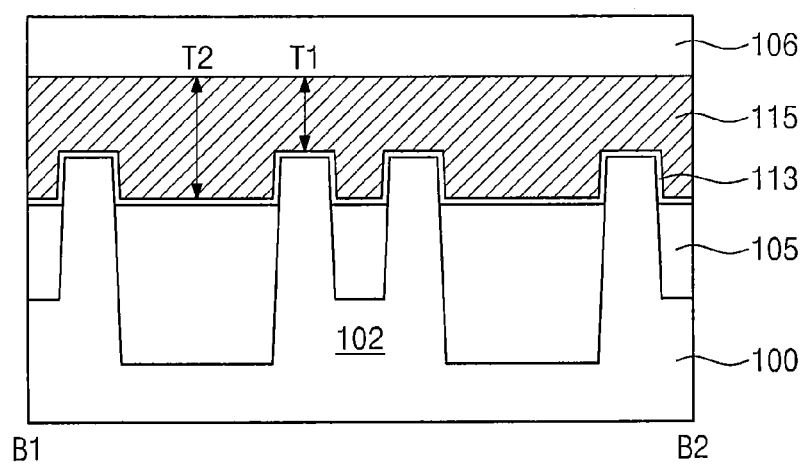

Referring to FIGS. 7A and 7B, the word line 115 (i.e., a gate electrode) may be buried and recessed in a lower portion of the groove 104. In an example embodiment, the gate insulation film 113 may be formed by thermally oxidizing the active region 102 exposed through the groove 104 or by deposing a silicon oxide film thereon. The word line 115 may be formed on the gate insulation film 113 in the groove 104. The word line 115 may be formed of a conductive film including poly-silicon, a metal, a metal silicide, or combinations thereof. The gate capping film 106 may be formed on the word line 115 in an upper portion of the groove 104 that is not filled with the word line 115. The gate capping film 106 may be formed of an insulating material (e.g., silicon nitride).

The gate insulation film 113 may surround a bottom surface and opposite sidewall surfaces of the word line 115. Since the word line 115 is formed on the active region 102 having the fin structure in the groove 104, a curved channel may be delimited.

Since a length of the curved channel is greater than a length of a straight channel, it may be possible to improve a short channel effect thereby.

The junction regions 11 and 12 may be formed in a self-aligned manner on the upper portion of the active region 102 through an ion injection process. The junction regions 11 and 12 may include the first junction region 11 and the second junction region 12 formed at opposite sides of the word line 115. The junction regions 11 and 12 may be doped with impurities of a different conductivity type from the substrate 100. For example, the junction regions 11 and 12 may be doped with impurities of n-type and the substrate 100 may be dope with impurities of p-type.

Since the active region 102 has the fin structure, the word line 115 may have a non-uniform thickness. For example, the word line 115 may have the first thickness T1 on the active region 102 and the second thickness T2 greater than the first thickness T1 on the device isolation film 105.

Through the gate insulation film 113 and the first and second junction regions 11 and 12 disposed in the upper portion of the active region 102 at opposite sides of the gate electrode, the U-shaped channel may be defined in the active region 102. The U-shaped channel may surround the side and the bottom of the gate electrode.

In an example embodiment, the U-shaped channel may have the retrograde channel. In other words, the U-shaped channel may have a projected range adjacent to the bottom of the device isolation film 105 and a doping profile in which a doping concentration increases away from the top surface of the active region 102.

Figure 7C:
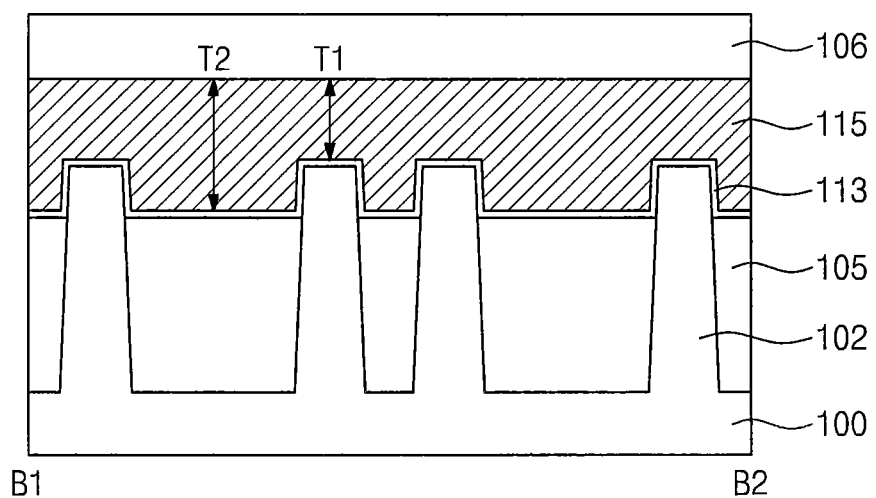

Referring to FIG. 7C, since a process in FIG. 7C is the same as the process illustrate in FIG. 7B, a detailed explanation of FIG. C will be omitted.

Figure 8A:
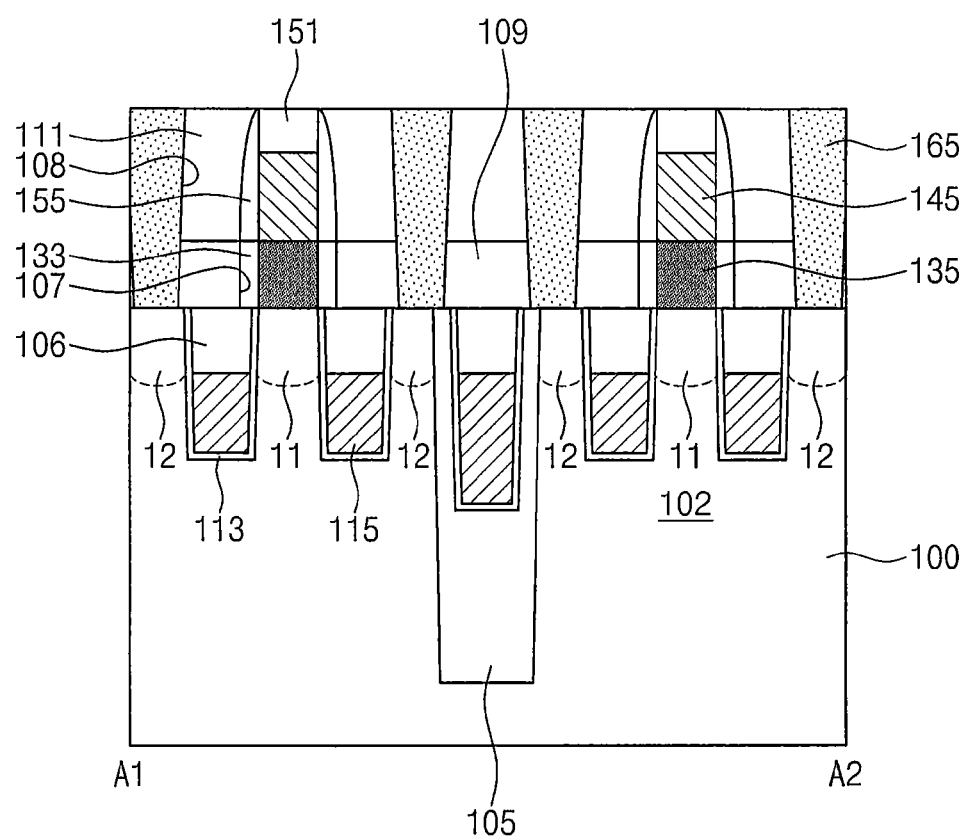
Figure 8B:
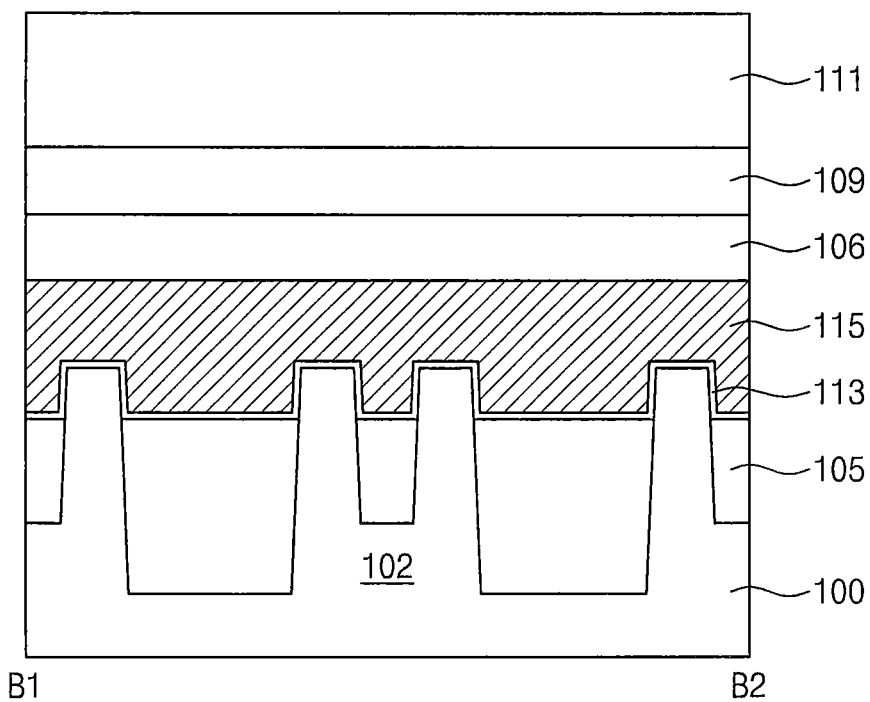

Referring to FIGS. 8A and 8B, the bit line contact 135 and the bit line 145 may be formed to be electrically in contact with the first junction region 11 and a storage node contact 165 may be formed to be electrically in contact with the second junction region 12.

In an example embodiment, the first interlayer dielectric film 109 may be formed by depositing, for example, silicon oxide. Next, a bit line contact hole 107 may be formed by etching the first interlayer dielectric film 109 to expose the first junction region 11. A spacer 133 may be formed on an inner sidewall of the bit line contact hole 107 by depositing and etching an insulation film (e.g., silicon nitride). Next, a bit line contact 135 may be formed by filling a conductive film (e.g., poly-silicon, a metal, a metal silicide, or combinations thereof) in the bit line contact hole 107 having the spacer 133. In an example embodiment, the spacer may not be formed.

After forming the bit line 145 on the first interlayer dielectric film 109, the second interlayer dielectric film 111 that covers the bit line 145 may be formed by depositing an insulating film (e.g., silicon oxide). The bit line spacer 155 may be formed on opposite sidewalls of the bit line 145 and the bit line capping film 151 may be formed on the bit line 145. The bit line spacer 155 and the bit line capping film 151 may be formed of, for example, silicon nitride.

A storage node contact hole 108 that exposes the second junction region 12 may be formed by passing through the first and second interlayer dielectric films 109 and 111. The storage node contact 165 that is electrically in contact with the second junction region 12 may be formed by filling a conductive film (e.g., poly-silicon, a metal, a metal silicide, or combination thereof) in the storage node contact hole 108.

Figure 8C:
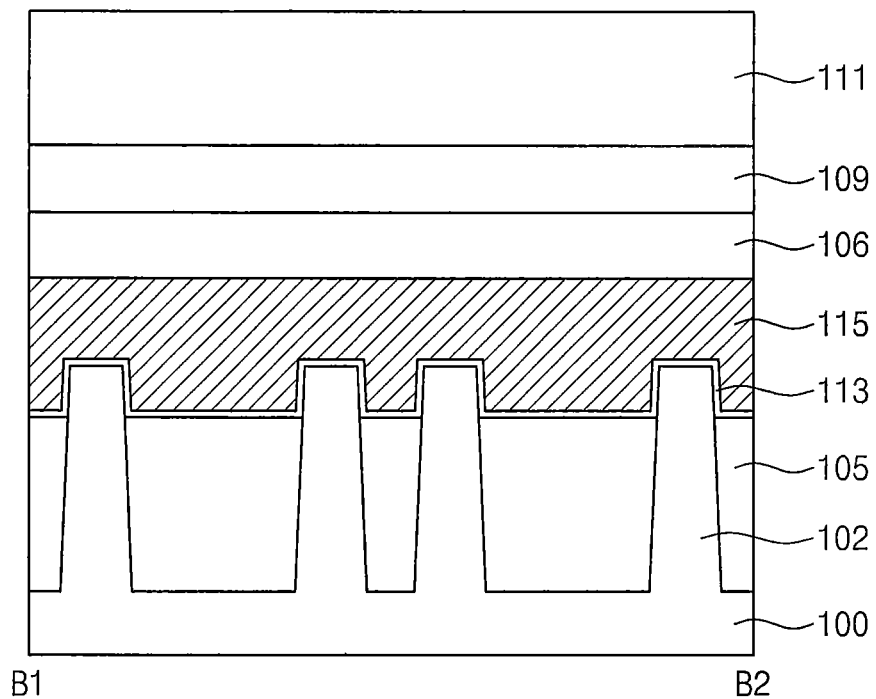

Referring to FIG. 8C, since a process in FIG. 8C is the same as the process illustrate in FIG. 8B, a detailed explanation of FIG. 8C will be omitted.

Figure 9A:
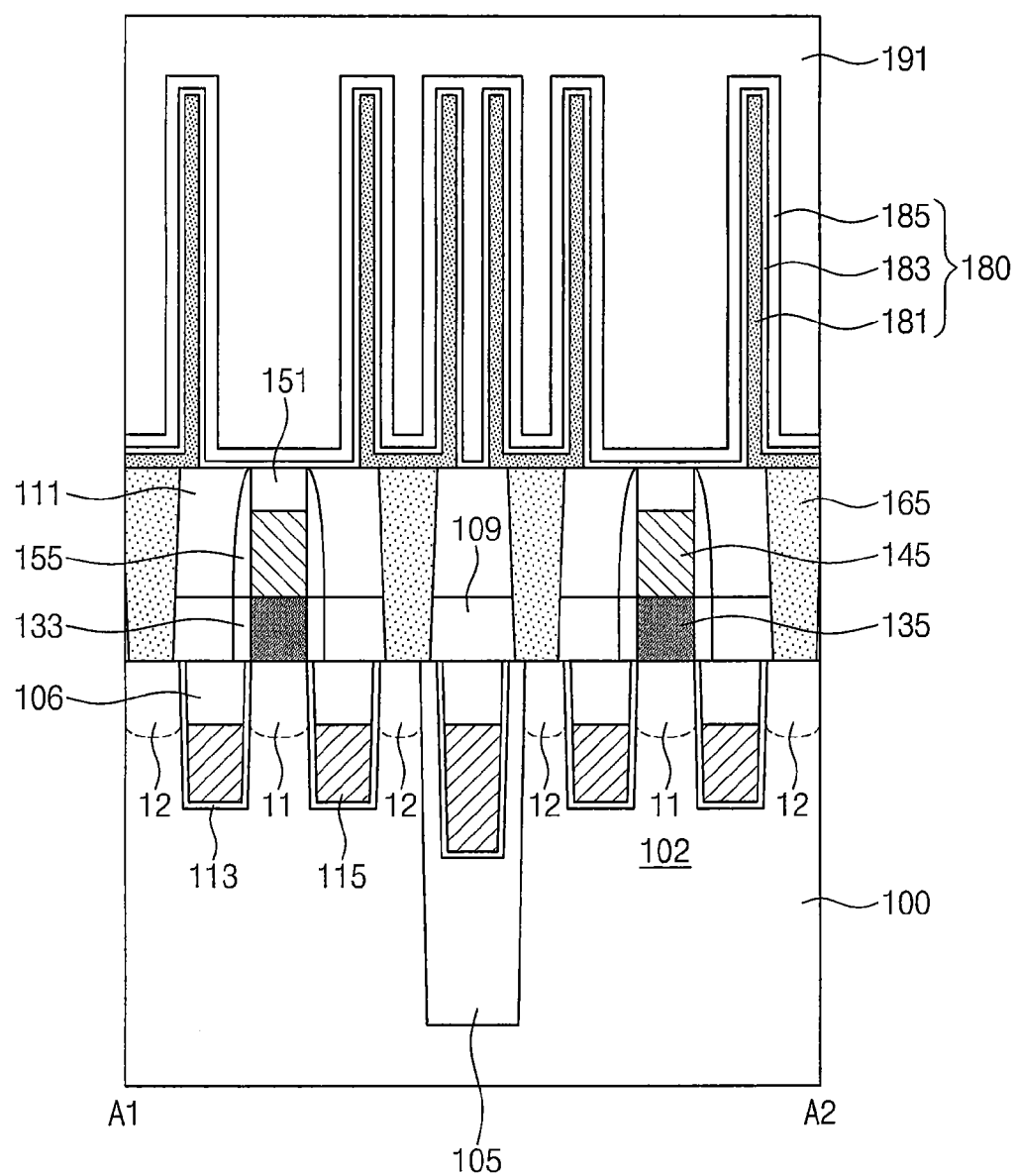
Figure 9B:
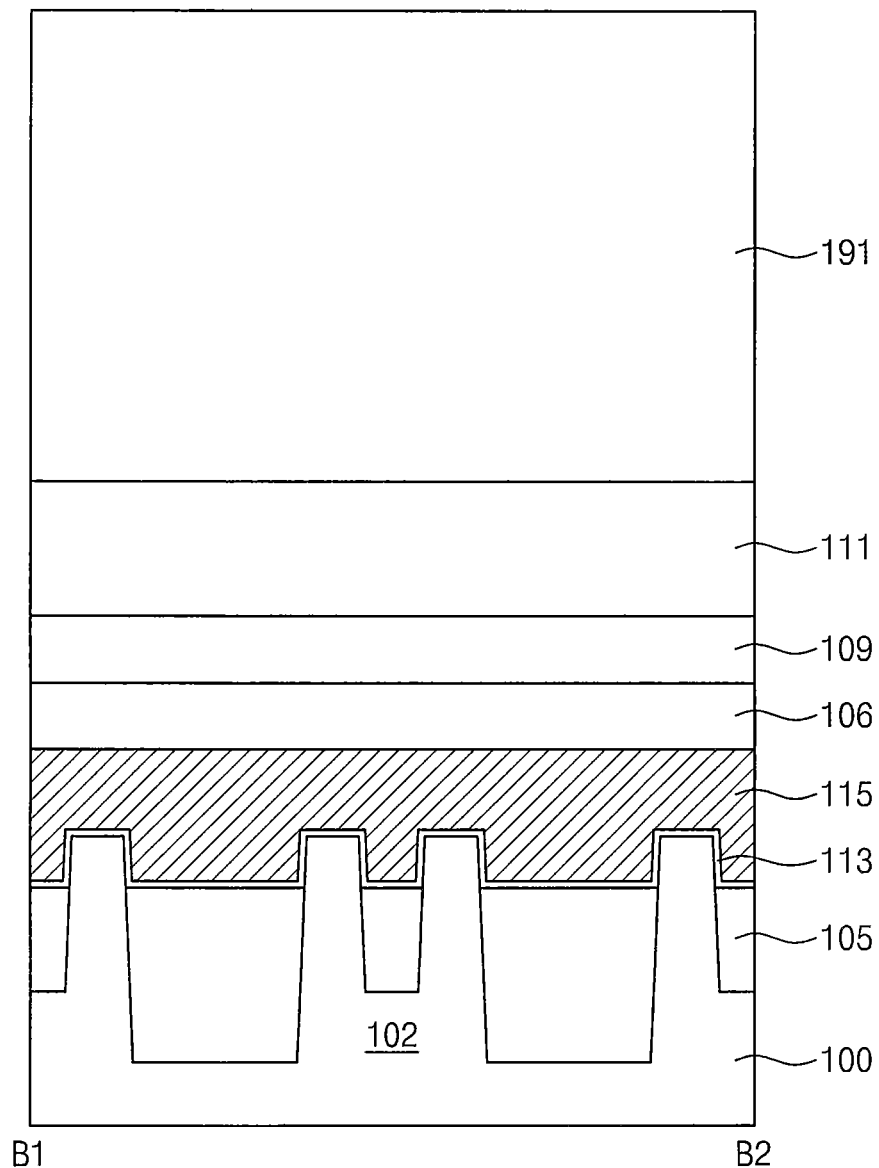

Referring to FIGS. 9A and 9B, a capacitor functioning as information storage element may be formed so as to be electrically in contact with the storage node contact 16, thereby forming the semiconductor device 1.

For example, the lower electrode 181 of the capacitor 180 that contacts the storage node contact 157 may be a cylinder and/or a pillar shapes. The dielectric film 183 of the capacitor 180 may be formed so as to extend along the profile of the lower electrode 181 of the capacitor 180. Next, the upper electrode 185 of the capacitor 180 that covers the dielectric film 183 of the capacitor 180 may be formed. The upper electrode 185 of the capacitor 180 may be a curved shape like the lower electrode 181 of the capacitor 180 or a plate shape. After forming the capacitor 180, the third interlayer dielectric film 191 may be formed by depositing an insulating film (e.g., silicon oxide).

Figure 9C:
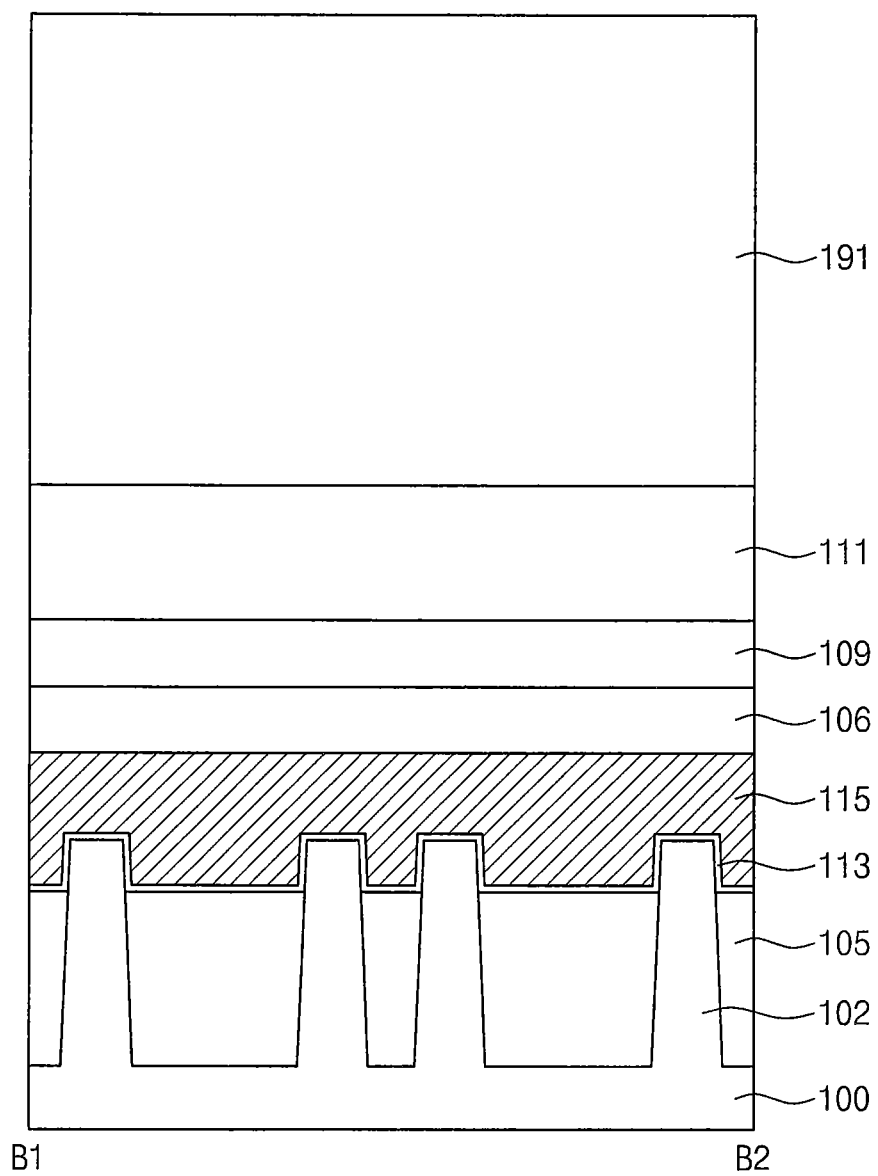

Referring to FIG. 9C, since a process in FIG. 9C is the same as the process illustrate in FIG. 9B, a detailed explanation of FIG. 9C will be omitted.

According to example embodiments of the inventive concept, a retrograde channel in which a doping concentration increases away downwards from a top surface of a substrate is formed such that the row hammer characteristics may be improved and a loss of data may be suppressed. Accordingly, it is possible to implement a semiconductor device that has excellent electrical properties and reliability.

Figure 11A:
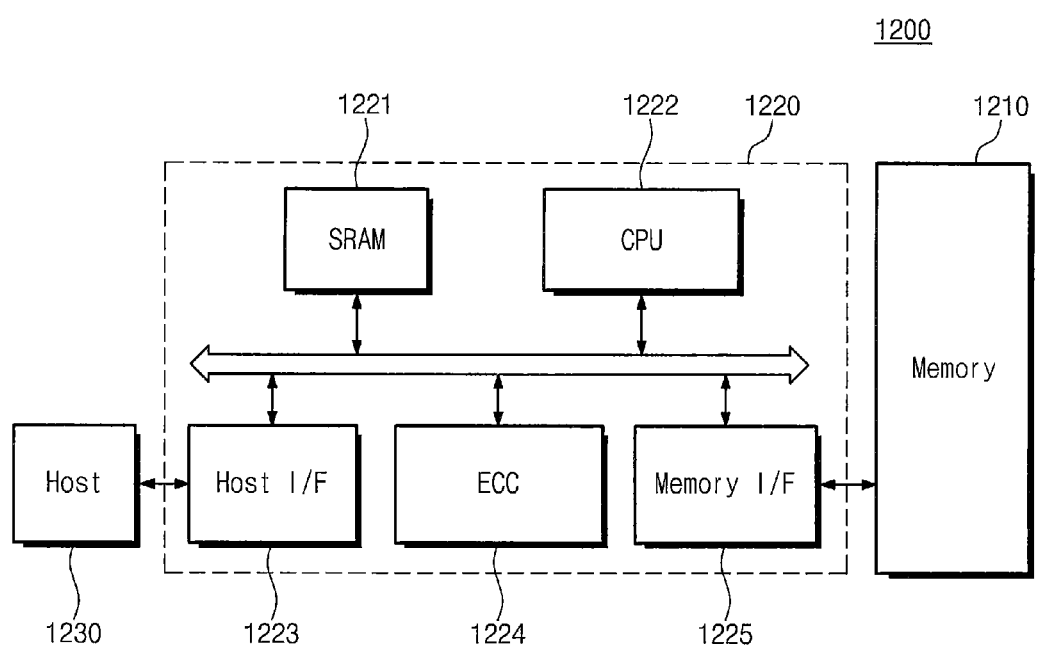
FIG. 11A illustrates a schematic block diagram of a memory card including a semiconductor device according to example embodiments of the inventive concepts.
Figure 11B:
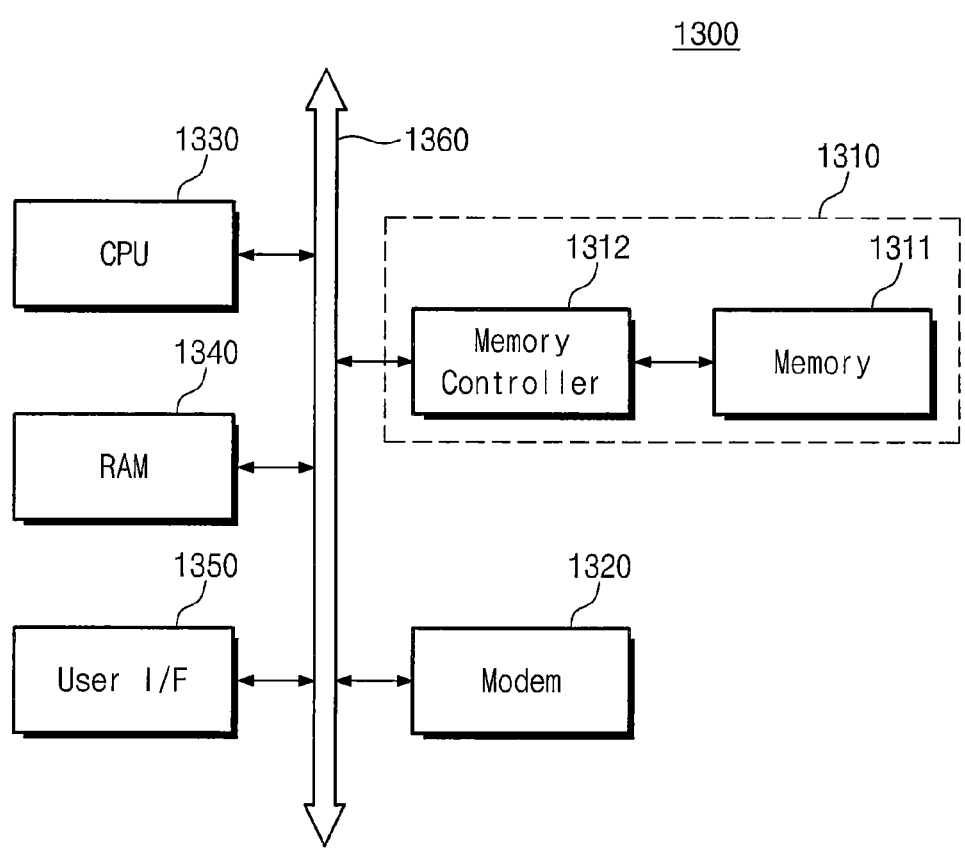
FIG. 11B illustrates a schematic block diagram of an information processing system including a semiconductor device according to example embodiments of the inventive concepts.

FIG. 11A is a schematic block diagram describing an example of a memory card including a semiconductor device according to example embodiments of the inventive concept. FIG. 11B is a schematic block diagram describing an example of an information processing system including a semiconductor device according to example embodiments of the inventive concept.

Referring to FIG. 11A, a memory 1210 that includes the memory device 1 according to example embodiments of the inventive concept may be applied to a memory card 1200. In one embodiment, the memory card 1200 may include a memory controller 1220 that controls an overall data exchange between a host 1230 and the memory 1210. A static random access memory (SRAM) 1221 may be used as a working memory of a central processing device (CPU) 1222. A host interface 1223 may include a data exchange protocol of the host 1230 that is connected to the memory card 1200. An error correction code (ECC) 1224 may detect and correct any error in data read from the memory 1210. A memory interface 1225 may communicate with the memory 1210. The central processing unit (CPU) 1222 may perform an overall control operation for data exchange of the memory controller 1220.

Referring to FIG. 11B, an information processing system 1300 may include a memory system 1310 including a semiconductor device 1 according to example embodiments of the inventive concept. The information processing system 1300 may include a mobile device or a computer, or the like. In one embodiment, the information processing system 1300 may include a modem 1320, a central processing device (CPU) 1330, a random access memory (RAM) 1340, and a user interface 1350, each of which is electrically connected to a system bus 1360, together with the memory system 1310. The memory system 1310 may include a memory 1311 and a memory controller 1312 and may be configured to substantially the same as the memory card 1200 of FIG. 11A. Data processed by the central processing device (CPU) 1330 or data input from the outside may be stored in the memory system 1310.

The information processing system 1300 may be provided as a memory card, a semiconductor disk device, such as a solid state disk (SSD), a camera image sensor (CIS), or other application chipset. In one embodiment, in a case where the memory system 1310 is configured with the semiconductor disk device (SSD), high-capacity data may be stably and reliably stored in the memory system 1310 of the information processing system 1300.

While the inventive concept has been particularly shown and described with reference to example embodiments thereof, it will be understood that various changes in form and details may be made therein without departing from the spirit and scope of the following claims.

What is claimed is:

1. A semiconductor device comprising:
   a semiconductor substrate of a first conductivity type comprising an active region defined therein by a device isolation region;
   a word line buried in the substrate;
   a bit line crossing the word line; and
   a channel region in the active region of the substrate underlying the word line and having a first ion implantation region providing a retrograde doping profile for a first dopant of the first conductivity type that increases in concentration in a direction away from the word line.

2. The semiconductor device of claim 1, further comprising a well ion implantation region in the substrate beneath the channel region.

3. The semiconductor device of claim 2, further comprising a second ion implantation region counter to the first ion implantation region in the substrate and having a projected range closer to a top of the device isolation region than a projected range of the first ion implantation region.

4. The semiconductor device of claim 1, wherein the device isolation region comprises:
   a first device isolation region having a first thickness; and
   a second device isolation region having a second thickness greater than the first thickness,
   wherein a bottom of the first device isolation region is closer to a top surface of the active region overlapped by the word line than a bottom of the second device isolation region.

5. A semiconductor device comprising:
   a semiconductor substrate comprising a plurality of active regions therein defined by a plurality of device isolation regions;
   a plurality of word lines completely buried in the semiconductor substrate and extending across the active regions; and
   a plurality of bit lines extending across the word lines, wherein channel regions in the active regions underlying the word lines have a retrograde doping profile with a maximum doping concentration at a level lower than a top surface of the active regions.

6. The semiconductor device of claim 5, wherein a top surface of the plurality of active region overlapping with the plurality of word lines at a higher level than a top surface of the plurality of device isolation regions overlapping with the plurality of word lines.

7. The semiconductor device of claim 6, wherein the plurality of device isolation regions comprises:
   a first device isolation region having a first thickness; and
   a second device isolation region having a second thickness greater than the first thickness,
   wherein a top of the first device isolation region is at approximately the same level as a top of the second device isolation region and a bottom of the first isolation region is at a higher level than a bottom of the second device isolation region.

8. The semiconductor device of claim 6, further comprising a well ion implantation region in the substrate beneath the channel regions and having a greater doping concentration than the channel regions.

9. The semiconductor device of claim 8, further comprising a counter ion implantation region in the substrate adjacent a top of the plurality of active regions or a bottom of the word line.

10. The semiconductor device of claim 6, wherein a doping concentration of the channel regions is at least $10^{13}$ atoms/cm$^2$.

11. A semiconductor device comprising:
    a substrate;
    a device isolation region in the substrate and defining an active region of the substrate;
    a word line overlying the device isolation region and the active region; and
    a channel region in the active region adjacent the device isolation region and having a doping profile for a first dopant that increases monotonically in a direction away from the word line from an upper surface of the active region to a level of a bottom of the device isolation region.

12. The semiconductor device of claim 11, wherein the upper surface of the active region is higher than an upper surface of the device isolation region.

13. The semiconductor device of claim 11, comprising a counter ion region in the channel region adjacent the upper surface of the active region and comprising a second dopant with a different conductivity type than the first dopant.

14. The semiconductor device of claim 11, wherein the device isolation region comprises a first device isolation region on a first side of the active region and the device further comprises a second device isolation region on a second side of the channel region.

15. The semiconductor device of claim 14, wherein a bottom of the first device isolation region is closer to the upper surface of the active region than a bottom of the second device isolation region.

16. The semiconductor device of claim 14, wherein bottoms of the first and second device isolation regions are the same distance from the upper surface of the active region.

17. The semiconductor device of claim 14, wherein the active region comprises a first active region between the first and second device isolation regions and the device further comprises:
    a second active region in the substrate separated from the first active region by the first device isolation region; and
    a third active region in the substrate separated from the first active region by the second device isolation region,
    wherein the first active region is closer to the second active region than to the third active region.

18. The semiconductor device of claim 14, further comprising a bit line crossing the word line.

19. The semiconductor device of claim 14, wherein the word line is buried in the active region between first and second junction regions.

20. The semiconductor device of claim 19, further comprising a capping layer on the word line.

* * * * *